United States Patent

Rotem et al.

[11] Patent Number: 5,903,490
[45] Date of Patent: May 11, 1999

[54] CUSTOMIZABLE INTEGRATED CIRCUIT DEVICE

[75] Inventors: Eran Rotem; Uzi Yoeli, both of Haifa, Israel; Richard Stephen Phillips, Ontario, Canada

[73] Assignee: Chip Express (Israel) Ltd., Haifa, Israel

[21] Appl. No.: 08/616,097

[22] Filed: Mar. 14, 1996

[30] Foreign Application Priority Data

Jan. 16, 1996 [IL] Israel ........................................ 116792

[51] Int. Cl.⁶ .................................................. G11C 5/06
[52] U.S. Cl. .............................................. 365/63; 365/51
[58] Field of Search ................................ 365/230.06, 51, 365/230.03, 189.08; 326/38

[56] References Cited

U.S. PATENT DOCUMENTS

| | | | |
|---|---|---|---|
| 4,004,286 | 1/1977 | Mrazek | 340/173 |
| 4,233,671 | 11/1980 | Gerzberg et al. | 365/105 |
| 4,271,487 | 6/1981 | Craycraft et al. | 365/185.07 |
| 4,554,696 | 11/1985 | Nye, Jr. | 15/21 |
| 4,706,216 | 11/1987 | Carter | 365/94 |
| 5,311,464 | 5/1994 | Takase et al. | 365/156 |
| 5,336,950 | 8/1994 | Popli et al. | 365/189.08 |
| 5,349,552 | 9/1994 | Zampaglione | 365/51 |
| 5,404,033 | 4/1995 | Wong et al. | 257/202 |
| 5,426,379 | 6/1995 | Trimberger | 326/39 |
| 5,469,003 | 11/1995 | Kean | 326/39 |
| 5,517,061 | 5/1996 | Azmanov | 257/758 |
| 5,640,358 | 6/1997 | Monden | 365/230.06 |
| 5,679,967 | 10/1997 | Janai et al. | 257/209 |

FOREIGN PATENT DOCUMENTS

| | | |
|---|---|---|
| 0079127 | 10/1982 | European Pat. Off. . |
| 2300952 | 11/1996 | United Kingdom . |
| 9516993 | 6/1995 | WIPO . |

OTHER PUBLICATIONS

Tran, et al., High Speed RAMS, IEEE 1989.
Aizaki, S., et al., A 15ns 4Mb CMOS SRAM, IEEE, 1990.
Kohno, Y., et al., A 14ns 1–Mbit CMOS SRAM with variable Bit Organization, IEEE Journal of Solid–State Circuits, vol. 22, No. 5, 1988.
Duan, D., Newly Arrayed: M5C Cell Contains 20 Transistors, EBM, Oct. 5, 1994.

*Primary Examiner*—David Nelms
*Assistant Examiner*—M. Tran
*Attorney, Agent, or Firm*—Browdy and Neimark

[57] ABSTRACT

A customizable gate array device including a customizable gate array portion and a customizable memory portion.

28 Claims, 39 Drawing Sheets

CUSTOMIZABLE INTEGRATED CIRCUIT DEVICE

FIELD OF THE INVENTION

The present invention relates to customizable integrated circuit devices generally.

BACKGROUND OF THE INVENTION

Random Access Memories (RAMs) are a very important components of complex electronic circuits. Two main types of RAM are in use today: static RAMs, in which data that is written is retained for a long period of time and dynamic RAMs, which are denser, but which do not retain data for long periods of time and, therefore, need to be periodically refreshed.

Data is written to and read from a RAM cell via ports. Single port RAMs have only one port, therefore, only one read or write operation can occur in a single port RAM cell at any given time. In many cases it is desirable to be able to read and write simultaneously (or with different clock speeds), so dual port RAMs are used. A typical use for dual port RAMs is for buffering between a fast CPU and a slow device. The CPU reads and writes to the RAM at one (fast or synchronous) speed and the device reads and writes to the RAM at another (slow or asynchronous) speed. There also exist N-port RAM designs where some ports are for reading or writing only and some are both for reading and for writing.

Gate arrays are integrated circuits that are designed to be customized. Typically, the lower (usually 8) layers of a gate array are standardized and define an array of transistors (or gates). The upper (usually 6) layers of a gate array are interconnection layers which define the interconnections between the transistors (gates). Since only the interconnection layers need to be customized to customize the gate array, gate arrays are typically used when a circuit is fabricated in numbers too low to justify the expense of designing a new integrated circuit. Since most electronic systems today contain a substantial amount of RAM, a system designer who uses gate arrays usually includes several RAM integrated circuits in his design. In cases where a special kind of RAM is desired or if separate RAM integrated circuits cannot be used, there are several solutions.

A first and least efficient solution is to use the gates of the gate array itself to create on-chip RAM. This solution is wasteful since the gates in the gate array are typically large, while memory cells are typically small.

A second solution is to provide un-configurable memory on the gate-array. The main drawback of this solution is that it is hard to know in advance the exact type and size of memory that will be needed for the customized device.

A third solution is to provide two small transistors with each gate so that by using the appropriate customization each gate can be converted to a memory cell. Since the added transistors are small, they do not add very much to the size of each cell.

ROMs are particularly useful when it is sought to repeatedly access fixed data. ROMs are normally more dense than RAMs. U.S. Pat. No. 5,311,464 describes a semiconductor memory cell forming a ROM cell from a RAM cell. Circuitry is provided to ensure that data written into the RAM cell before an electrical power supply is cut off is retained, providing a ROM type functionality.

SUMMARY OF THE INVENTION

The present invention seeks to provide an improved integrated circuit device.

There is thus provided in accordance with a preferred embodiment of the present invention a customizable gate array device including a customizable gate array portion and a customizable memory portion.

Preferably, the customizable memory portion includes a multiplicity of identical memory cells and customizable memory cell connections enabling the multiplicity of identical memory cells to function selectably as a RAM or a ROM.

Additionally or alternatively, the customizable memory portion includes a multiplicity of identical memory cells and customizable memory cell connections enabling the multiplicity of identical memory cells to be actuable via a selectable number of ports.

The customizable gate array device also preferably includes customizable memory cell connections enabling the multiplicity of identical memory cells to function selectably as a RAM or a ROM.

There is also provided in accordance with a preferred embodiment of the present invention a customizable memory device including a multiplicity of identical memory cells and customizable memory cell connections enabling the multiplicity of identical memory cells to function selectably as one or more memory unit.

Preferably, the one or more memory unit includes a plurality of memory units of the same type, a plurality of memory units of different types, a plurality of memory units of the same size or a plurality of memory units of different sizes.

Additionally in accordance with a preferred embodiment of the present invention there is provided a customizable memory device including a multiplicity of identical memory cells and customizable memory cell connections enabling the multiplicity of identical memory cells to function selectably as a RAM or a ROM.

There is further provided in accordance with a preferred embodiment of the present invention a customizable memory device including a multiplicity of identical memory cells and customizable memory cell connections enabling the multiplicity of identical memory cells to be actuable via a selectable number of ports.

Preferably, the customizable memory device also includes customizable memory cell connections enabling the multiplicity of identical memory cells to function selectably as a RAM or a ROM.

Preferably, the customizable memory portion includes a non-customizable CMOS structure up to and including a first metal layer and customizable at least second and third metal layers formed over the first metal layer.

In accordance with a preferred embodiment of the present invention the customizable second and third metal layers include customizable links formed over memory cells.

Preferably, the customizable second and third metal layers include customizable links formed over active areas of memory cells.

In accordance with a preferred embodiment of the present invention, the customizable memory portion is laser customizable.

Preferably, the customizable gate array portion and the customizable memory portion are both customizable by the same technique.

In accordance with a preferred embodiment of the present invention, the customizable gate array portion and the customizable memory portion are both laser customizable.

Preferably, the customizable gate array portion and the customizable memory portion are both customizable by etching of the customizable links.

In accordance with a preferred embodiment of the present invention the customizable second and third metal layers include custom configured metal layers providing selected connections.

Preferably, the customizable memory portion includes at least two custom configured metal layers providing selected connections.

In accordance with a preferred embodiment of the present invention, the customizable gate array portion and the customizable memory portion both include at least two custom configured metal layers providing selected connections.

Preferably, the customizable memory includes at least one customizable decoder and the customizable memory includes at least one customizable data interface.

In accordance with a preferred embodiment of the present invention, the customizable decoder has two address ports and is splittable into two independently operable decoder portions, each counting up from zero and being associated with one of the two address ports.

Methods of producing and customizing the customizable integrated circuit devices are also provided in accordance with a preferred embodiment of the present invention.

BRIEF DESCRIPTION OF THE DRAWINGS

The present invention will be understood and appreciated more fully from the following detailed description, taken in conjunction with the drawings in which:

FIGS. 5A and 5B together define a preferred layout corresponding to the circuitry of FIG. 4A, wherein FIG. 5A is a simplified illustration of the layout of a non-customizable CMOS structure up to and including a first metal layer, and FIG. 5B is a simplified illustration of a layout of customizable second and third metal layers formed over the structure shown in FIG. 5A, including customizable links formed over active areas of memory cells;

FIGS. 6A and 6B together define a preferred layout corresponding to the circuitry of either FIG. 4B or FIG. 4C, wherein FIG. 6A is a simplified illustration of the layout of a non-customizable CMOS structure up to and including a first metal layer, and FIG. 6B is a simplified illustration of a layout of customizable second and third metal layers formed over the structure shown in FIG. 6A including customizable links;

DETAILED DESCRIPTION OF PREFERRED EMBODIMENTS

Figure 1:
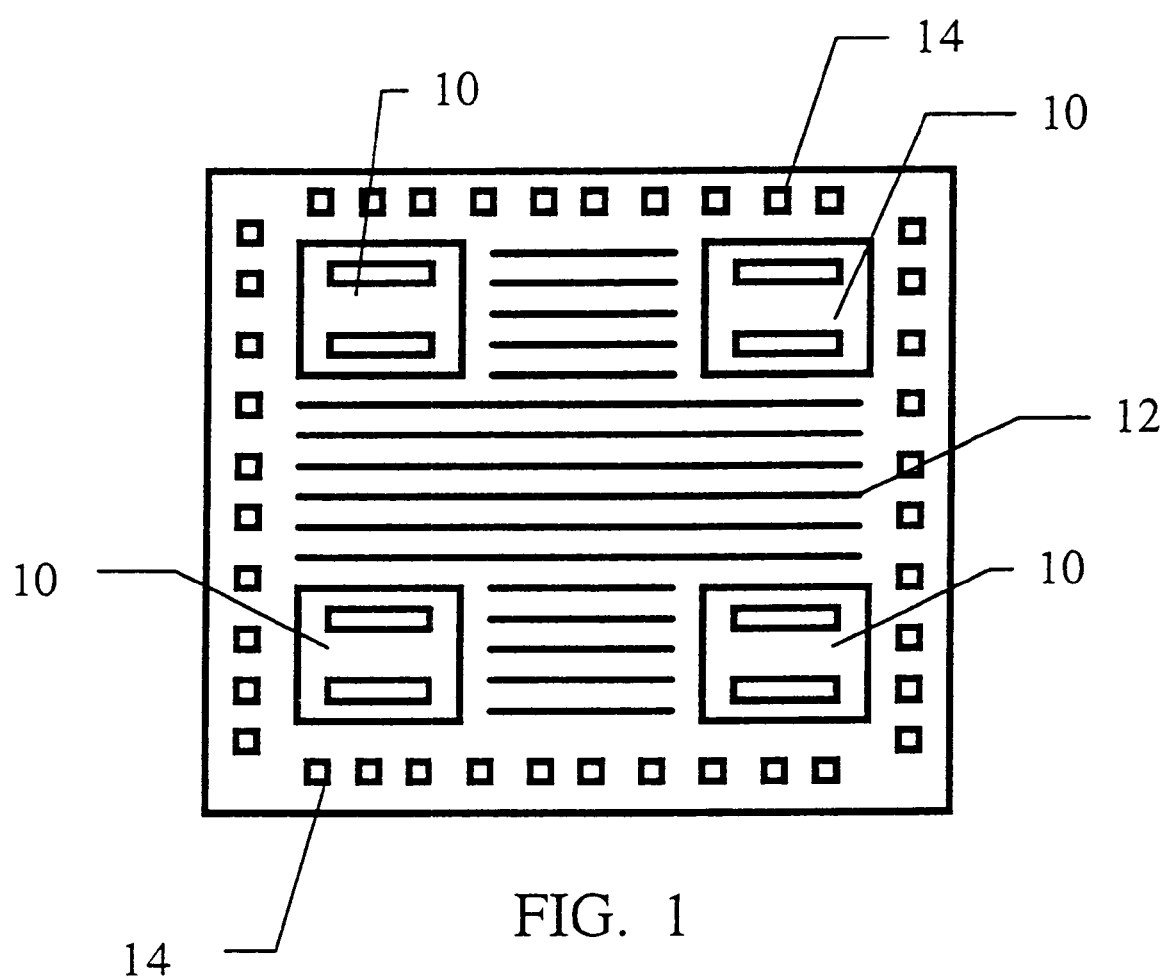
FIG. 1 is a simplified illustration of a customizable gate array device constructed and operative in accordance with a preferred embodiment of the present invention.

Reference is now made to FIG. 1, which is a simplified illustration of a customizable gate array device constructed and operative in accordance with a preferred embodiment of the present invention. The gate array of FIG. 1 typically includes a plurality of customizable memory blocks 10 which are interconnected with a customizable array of cells 12. Disposed preferably at the periphery of the device are a plurality of customizable input/output cells 14.

The customizable array of cells 12 may be any suitable customizable array of gate array cells, preferred embodiments of which are described and claimed in one or more of Applicant/Assignee's U.S. Pat. Nos. 4,924,287; 4,875,971; 4,933,738; 5,049,969; 5,260,597 and 5,111,273. Alternatively or additionally, the customizable array of cells 12 may comprise an array of identical multiple input, functional selectable logic cells, such as described in Applicant/Assignee's U.S. patent application Ser. No. 08/290,550, filed Aug. 15, 1994 and entitled "A Customizable Logic Array Device". The disclosures of the aforesaid patents and patent application are hereby incorporated by reference.

The number and size of memory blocks 10, the cells in array 12 and the input/output cells 14 may be any suitable number and size.

Figure 2:
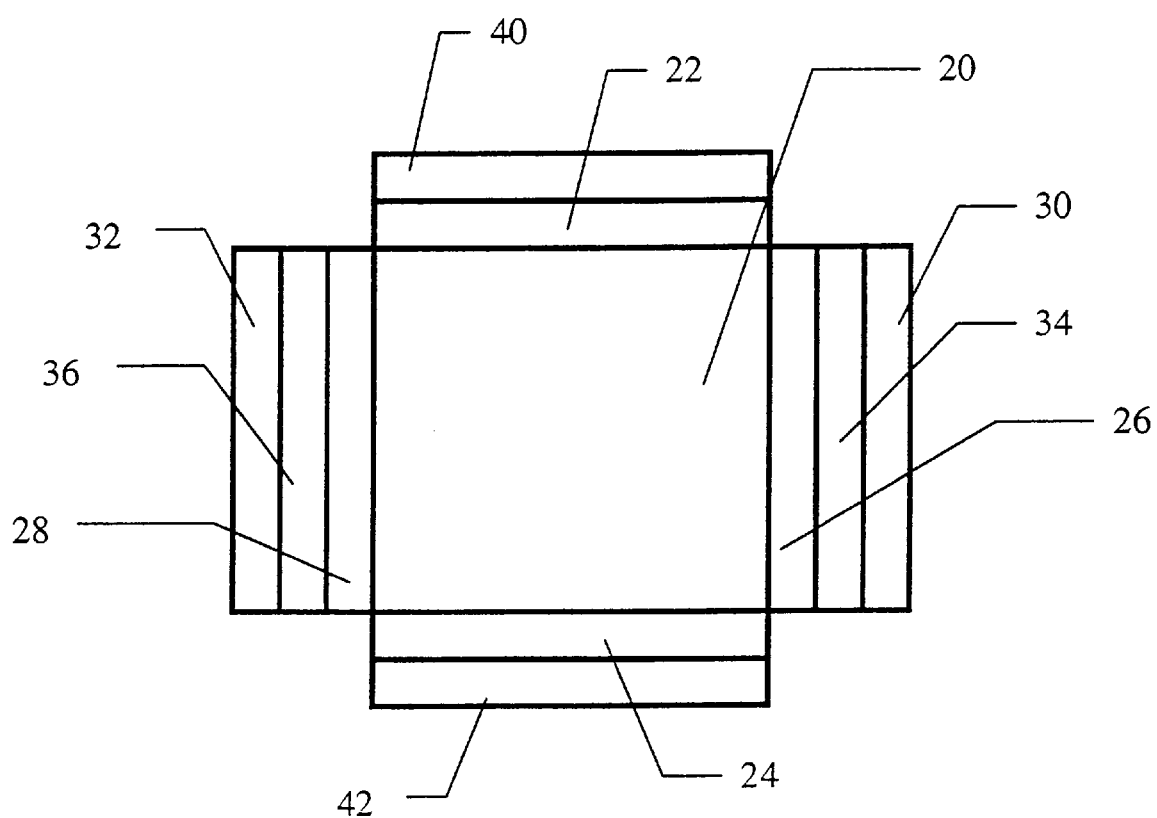
FIG. 2 is a simplified illustration of a customizable RAM device constructed and operative in accordance with a preferred embodiment of the present invention.

Reference is now made to FIG. 2, which is a simplified illustration of a customizable RAM device constructed and operative in accordance with a preferred embodiment of the present invention. The device of FIG. 2 preferably includes a customizable memory block 20, which may be similar to block 10, employed in the embodiment of FIG. 1 Associated with the memory there are preferably provided a pair of customizable X-decoders 22 and 24 and a pair of customizable Y-decoders 26 and 28.

A pair of sets of input/output cells 30 and 32 is coupled to respective Y-decoders 26 and 28 by respective customizable interfaces 34 and 36. It is appreciated that the sets of input/output cells 30 and 32 may alternatively be incorporated as part of interfaces 34 and 36. A pair of sets of input cells 40 and 42 is coupled to respective X decoders 22 and 24.

In accordance with a preferred embodiment of the present invention, and as described in greater detail hereinbelow, the device of FIG. 2 may provide various types and sizes of memories, such as, for example, multiple single port RAMS, one or more ROM and one or more single or multiple port RAM or combinations of the foregoing.

Figure 3:
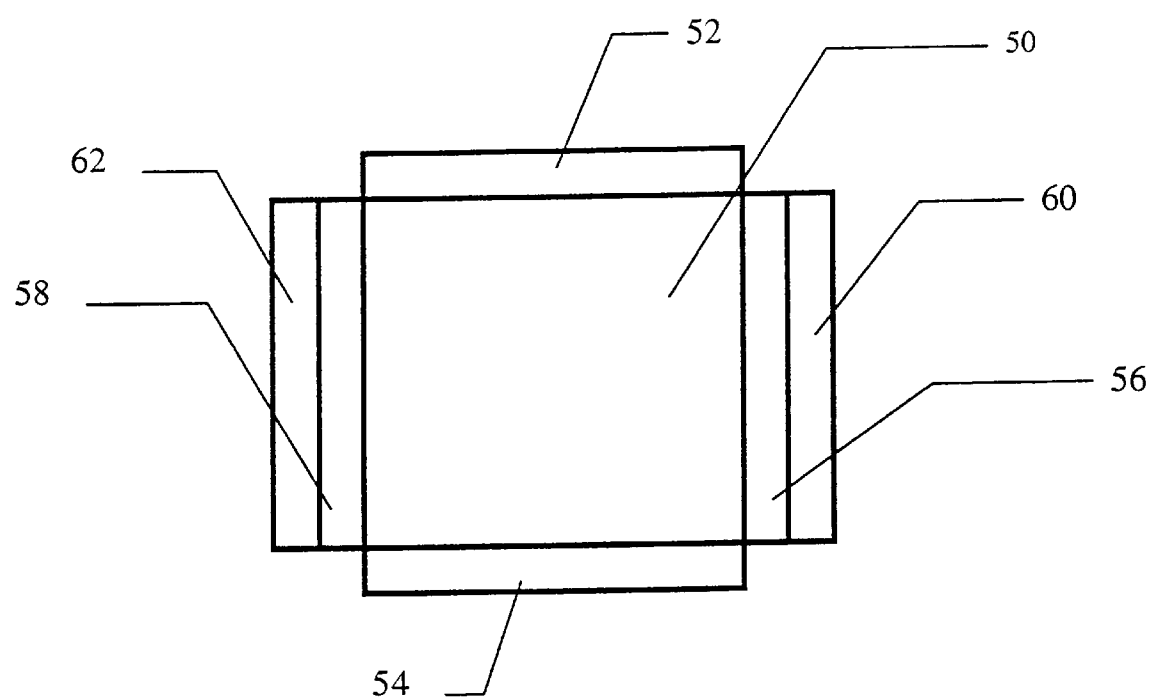
FIG. 3 is a simplified illustration of a customizable memory portion of the device of FIG. 1 or FIG. 2.

Reference is now made to FIG. 3, which is a simplified illustration of a customizable memory portion of the device of FIG. 1 or FIG. 2. It is seen that the circuitry of FIG. 3 may be identical to that of FIG. 2 when the input/output cells are eliminated. In FIG. 3, the memory block is indicated by reference numeral 50, the X decoders are indicated by respective reference numerals 52 and 54, the Y decoders are indicated by respective reference numerals 56 and 58 and the customizable interfaces are indicated by reference numerals 60 and 62.

Figure 4A:
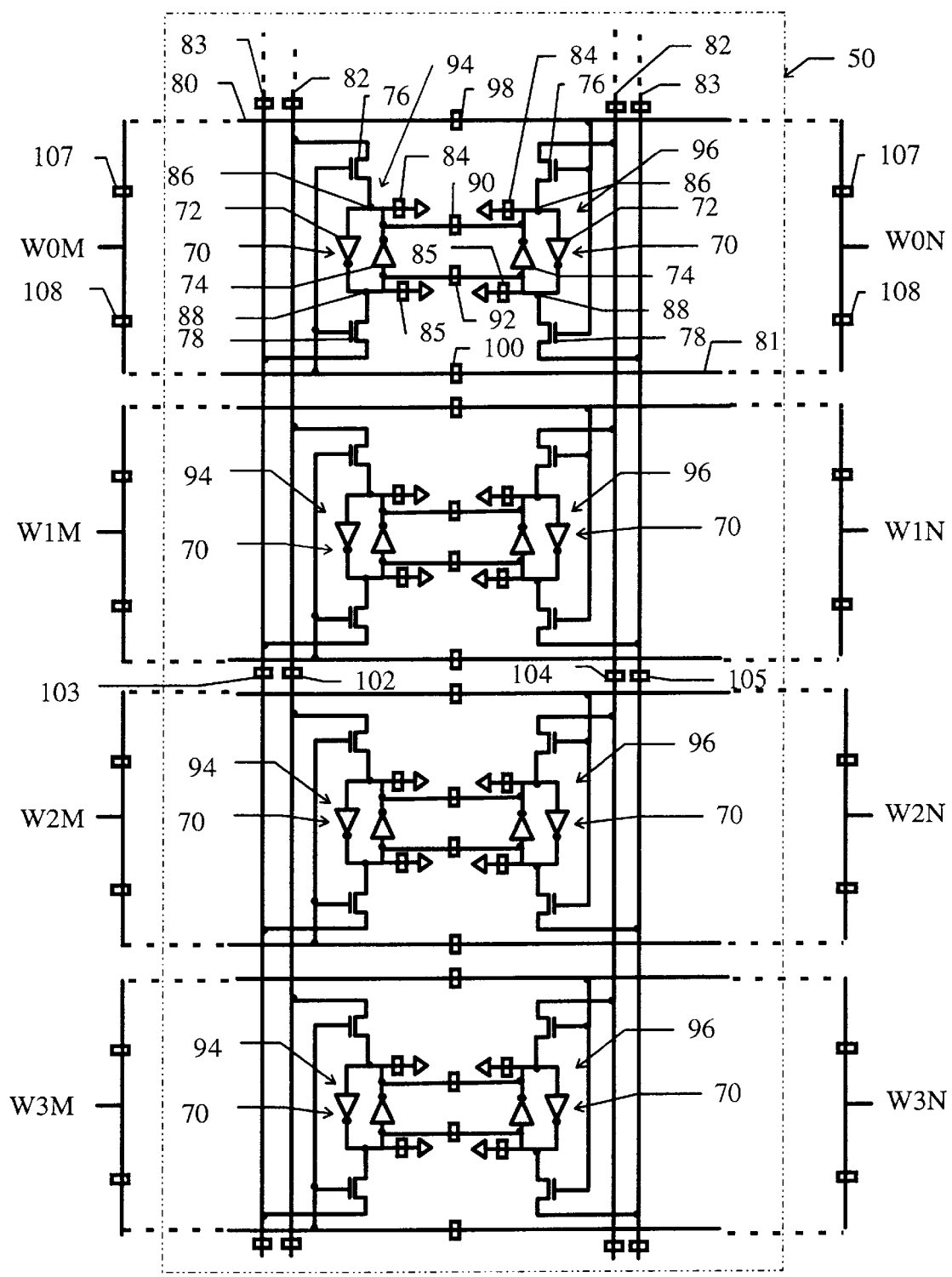
FIGS. 4A, 4B and 4C are simplified illustrations of customizable portions of the circuitry of FIG. 3 including a customizable array of memory cells and customizable decoder portions.
Figure 4B:
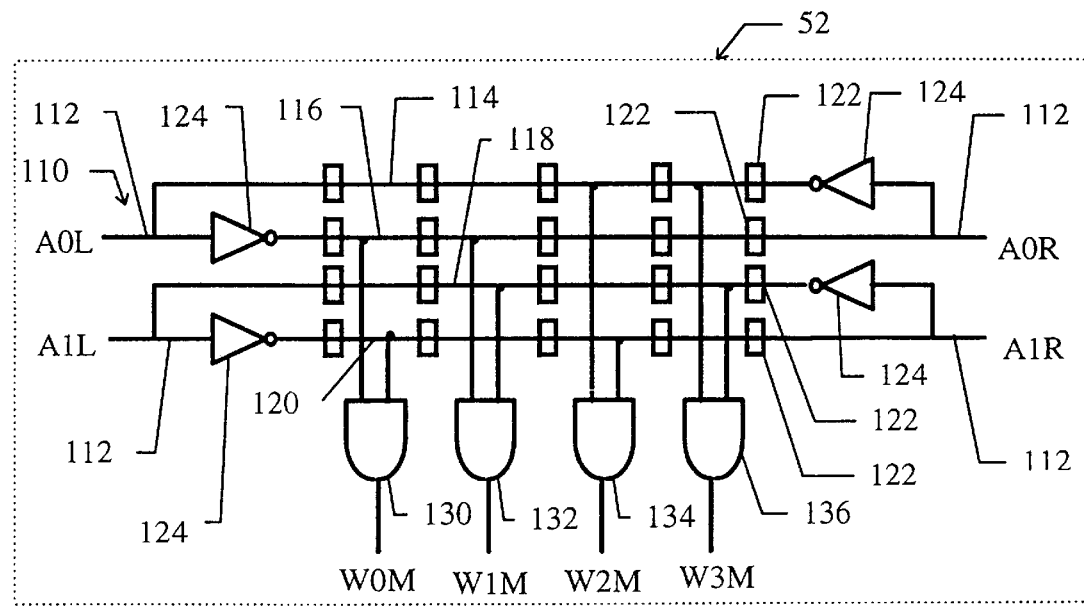
Figure 4C:
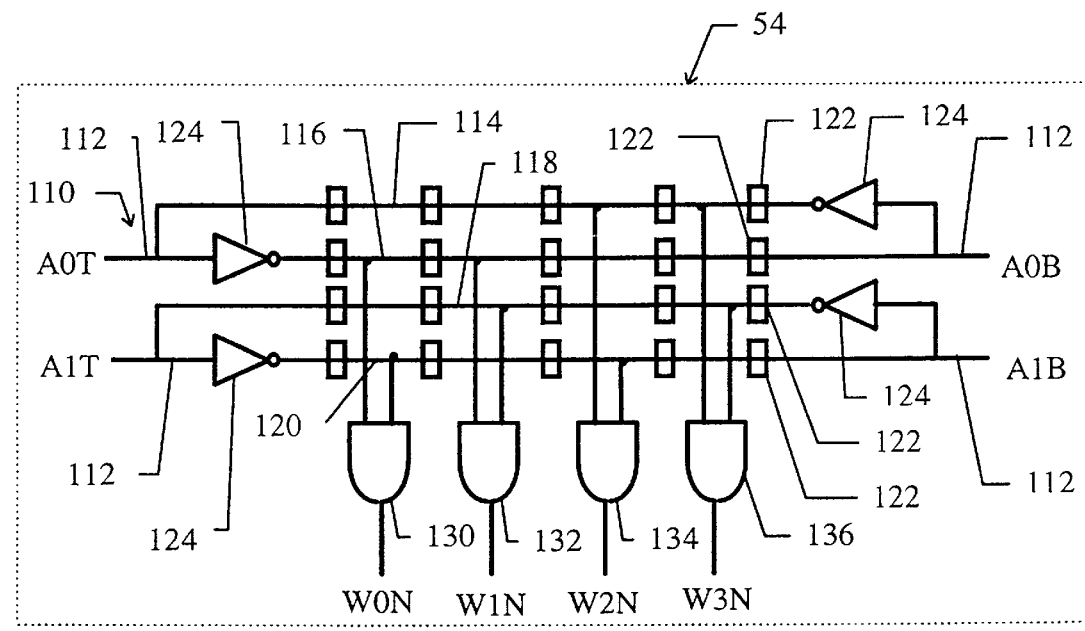

Reference is now made to FIGS. 4A, 4B and 4C, which are simplified illustrations of customizable portions of the circuitry of FIG. 3 including a customizable array of memory cells and a customizable decoder portion. The circuitry of FIG. 3 includes additional customizable portions which are not illustrated in FIGS. 4A–4C or described herein for the sake of conciseness, realization of these additional portions being well within the skill of a person of the art in view of the disclosure herein.

FIG. 4A illustrates part of the memory block 50 and FIGS. 4B and 4C illustrate the X decoders 52 and 54 respectively.

Referring now to FIG. 4A, it is seen that the memory block portion includes a plurality of identical customizable RAM cells 70, each including a pair of inverters 72 and 74, a BIT line transistor 76 and a BITN line transistor 78. The memory block portion also includes select lines 80 and 81 and BIT and BITN lines 82 and 83 respectively which communicate with the RAM cells 70.

In accordance with a preferred embodiment of the invention customizable ground connections 84 and 85 respectively are provided at the junction 86 of transistor 76 and the input to inverter 72 and at the junction 88 of transistor 78 and the input to inverter 74. These customizable ground connections enable the RAM cell 70 to be customized into a ROM.

Further in accordance with a preferred embodiment of the present invention, customizable links 90 and 92 respectively are provided joining respective junctions 86 and junctions 88 of adjacent cells 70, here also designated by reference numerals 94 and 96. Links 90 and 92 are intact when dual port RAMs are provided and are cut when single port RAMs or ROMs are provided.

Additionally in accordance with a preferred embodiment of the present invention, customizable links 98 and 100 respectively are provided along word select lines 80 and 81. Customizable links 102, 103, 104 and 105 respectively are also provided along BIT and BITN lines 82 and 83 joining every pair of adjacent cells 94 and every pair of adjacent cells 96.

Customizable links 98–105 enable the size of the RAM or ROM to be determined. When these links are intact, they interconnect various cells 70 into multicell ROMs or RAMs.

Further in accordance with a preferred embodiment of the present invention, customizable links 107 and 108 are provided outside of the memory block 50 and along the word select lines 80 and 81 at both edges of the array of cells 70 adjacent the X decoders 22 and 24 respectively When both are intact or one or both are cut, they define a single port RAM, a ROM or a dual port RAM.

Reference is now made to FIG. 4B, which illustrates part of a customizable X decoder 52. A plurality of address lines 110 are provided. In the illustrated embodiment two predecoded address lines are provided having a total of four decoder address inputs 112, labeled A0L, A1L, A0R and A1R and four line portions, indicated by reference numerals 114, 116, 118 and 120.

At each decoder address input 112 a non-inverted address line portion extends directly therefrom and is provided with a plurality of spaced customizable links 122. At each decoder address input 112 there is provided an inverter 124, downstream of which extends an inverted address line portion, which is also provided with a plurality of spaced customizable links 122.

It is a particular feature of the present invention that an inverse symmetry is provided between the left and right decoder address inputs 112, such that each non-inverted address line portion of a given left decoder address input 112 also constitutes an inverted address line portion of a given right decoder address input 112 and vice versa. Similarly, each inverted address line portion of a given left decoder address input 112 also constitutes a non-inverted address line portion of a given right decoder address input 112 and vice versa.

The inputs to a plurality of AND gates, typically four in number, here indicated by reference numerals 130, 132, 134 and 136, are connected to different pairs of address line portions. AND gate 130 is typically connected to the address line portions 116 and 120; AND gate 132 is typically connected to the address line portions 116 and 118; AND gate 134 is typically connected to the address line portions 114 and 120 and AND gate 136 is typically connected to the address line portions 114 and 118.

The outputs of AND gates 130–136 are labeled W0M, W1M, W2M and W3M and are supplied to word select lines 80 and 81 of four respective pairs of memory cells 70, as seen in FIG. 4A.

It is a particular feature of the present invention that the decoder of FIG. 4B can be customized by laser ablation, etching or customized metal deposition at the customizable links 122 so as to constitute one or two decoders both of which count up from zero, due to the above-described inverse symmetry. If two decoders are produced they may each have between one and three output AND gates.

Reference is now made to FIG. 4C, which illustrates X-decoder 54. It can be seen that X decoder 54 is essentially identical to X decoder 52, illustrated in FIG. 4B, and has the same elements labeled identically. The only distinction is that the address inputs are labeled A0T, A1T, A0B and A1B and the output AND gates are here labeled W0N, W1N, W2N and W3N.

The outputs of AND gates W0N, W1N, W2N and W3N and are supplied to word select lines 80 and 81 of four respective pairs of memory cells 70, as seen in FIG. 4A.

Figure 5A:
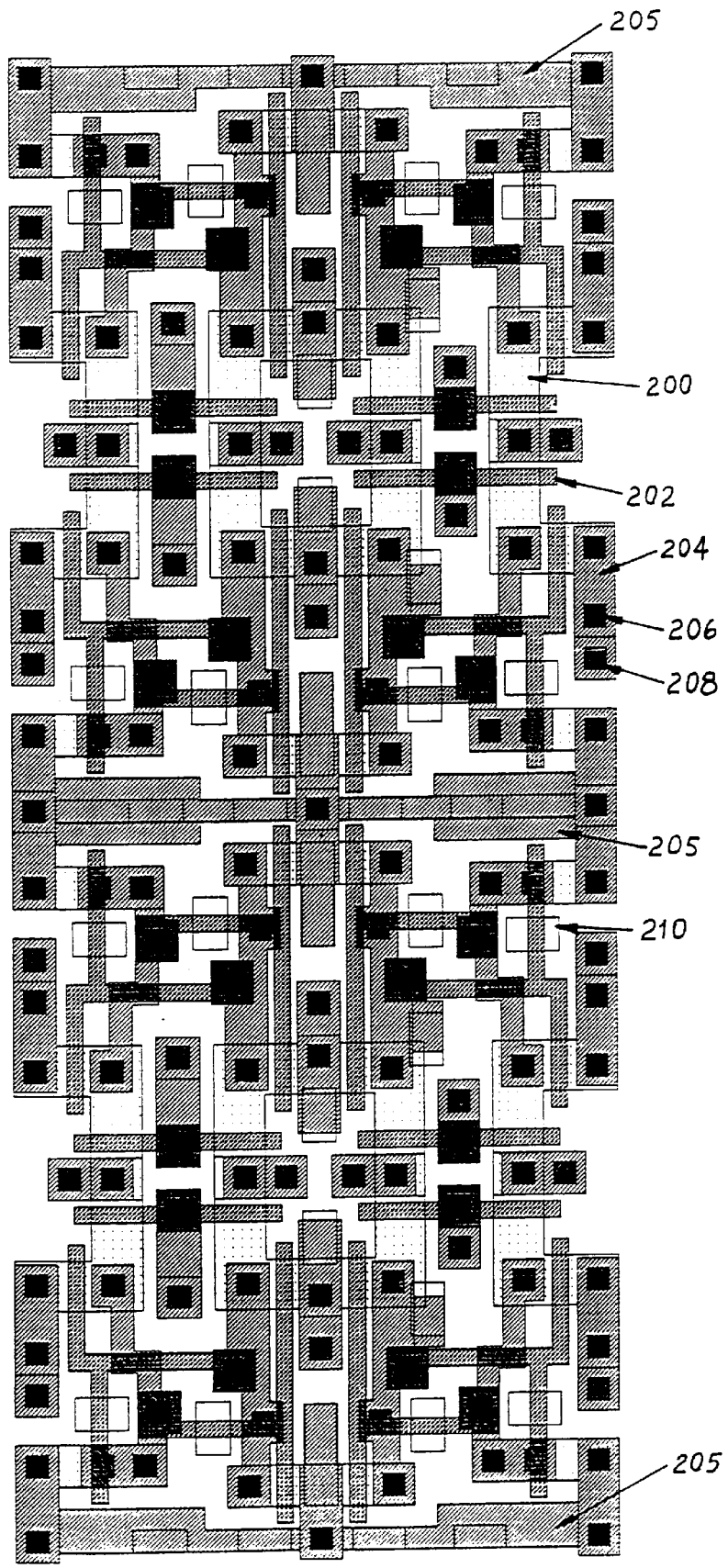
Figure 5B:
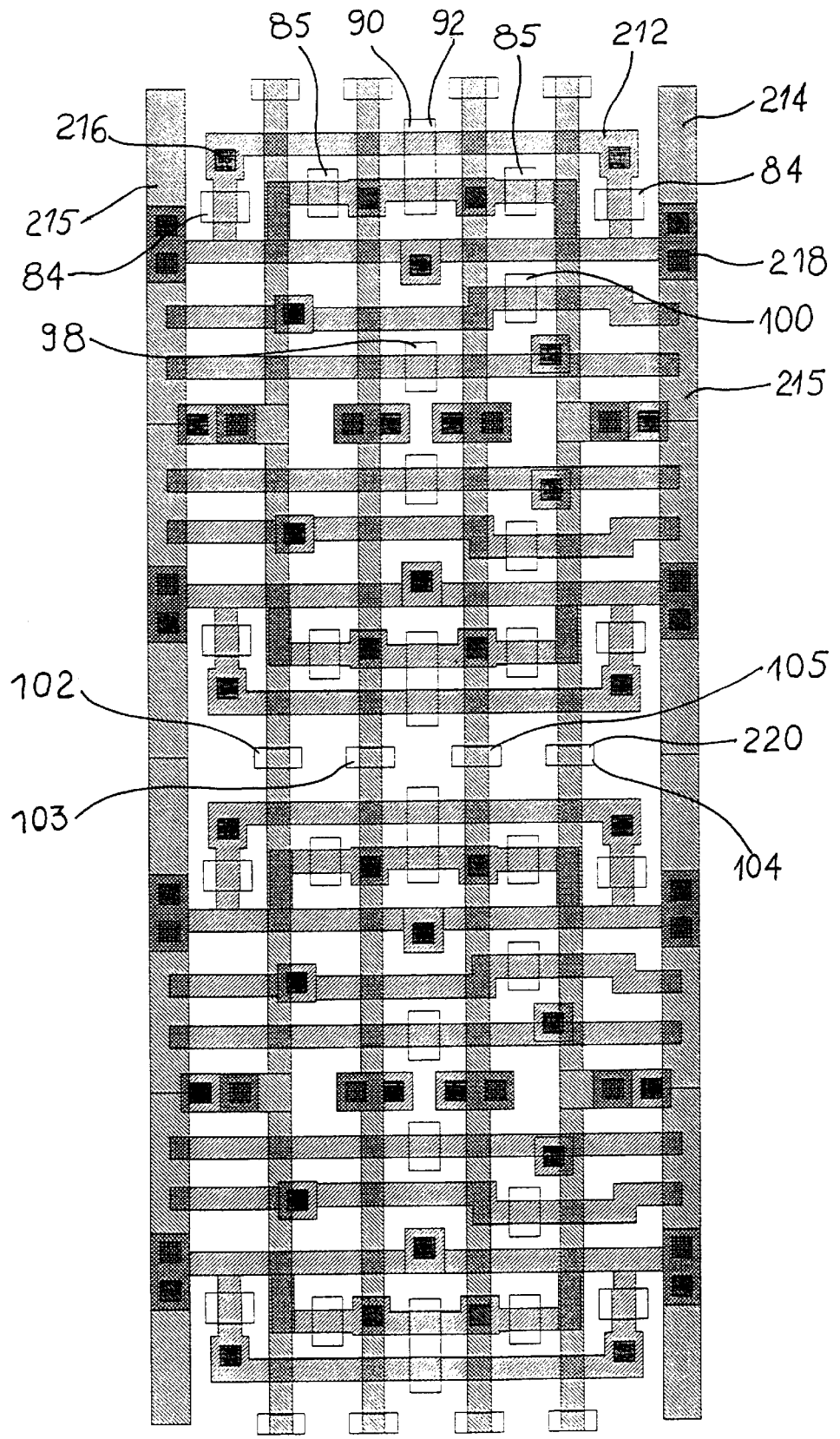

Reference is now made to FIGS. 5A and 5B, which together define a preferred layout corresponding to the circuitry of FIG. 4A. The illustration of FIG. 5A roughly corresponds to that portion of FIG. 4A which illustrates part of a memory cell array. The diffusion layer is indicated by reference numeral 200; the polysilicon layer is indicated by reference numeral 202. The metal 1 layer is indicated by reference numeral 204 and the metal 1 VSS lines are indicated specifically by reference numeral 205. Contacts are indicated by reference numerals 206 and via 1s, by reference numerals 208. The general location of customization links are indicated by reference numerals 210 generally.

Reference is now made to FIG. 5B, which is a simplified illustration of a layout of customizable second and third metal layers formed over the structure shown in FIG. 5A, including customizable links formed over active areas of memory cells. The metal 2 layer is indicated by reference numeral 212 and the metal 3 layer is indicated by reference numeral 214. Metal 3 VDD lines are indicated specifically by reference numeral 215. Via 1s are indicated by reference numerals 216 and via 2s, by reference numerals 218. The general location of customization links are indicated by reference numerals 220 generally, the specific links referred to above in connection with FIG. 4A, being indicated by identical reference numerals in FIG. 5B.

Figure 6A:
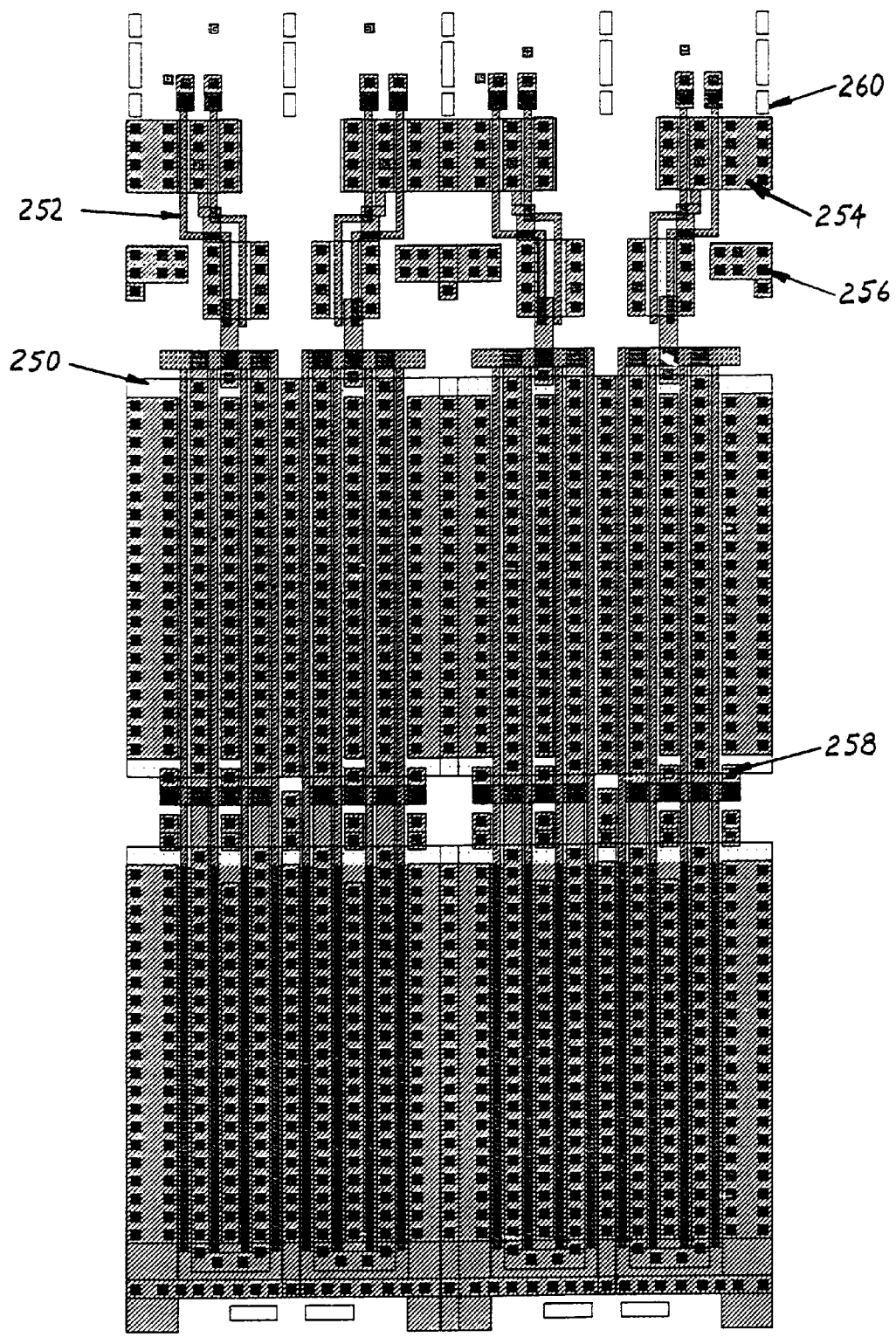
Figure 6B:
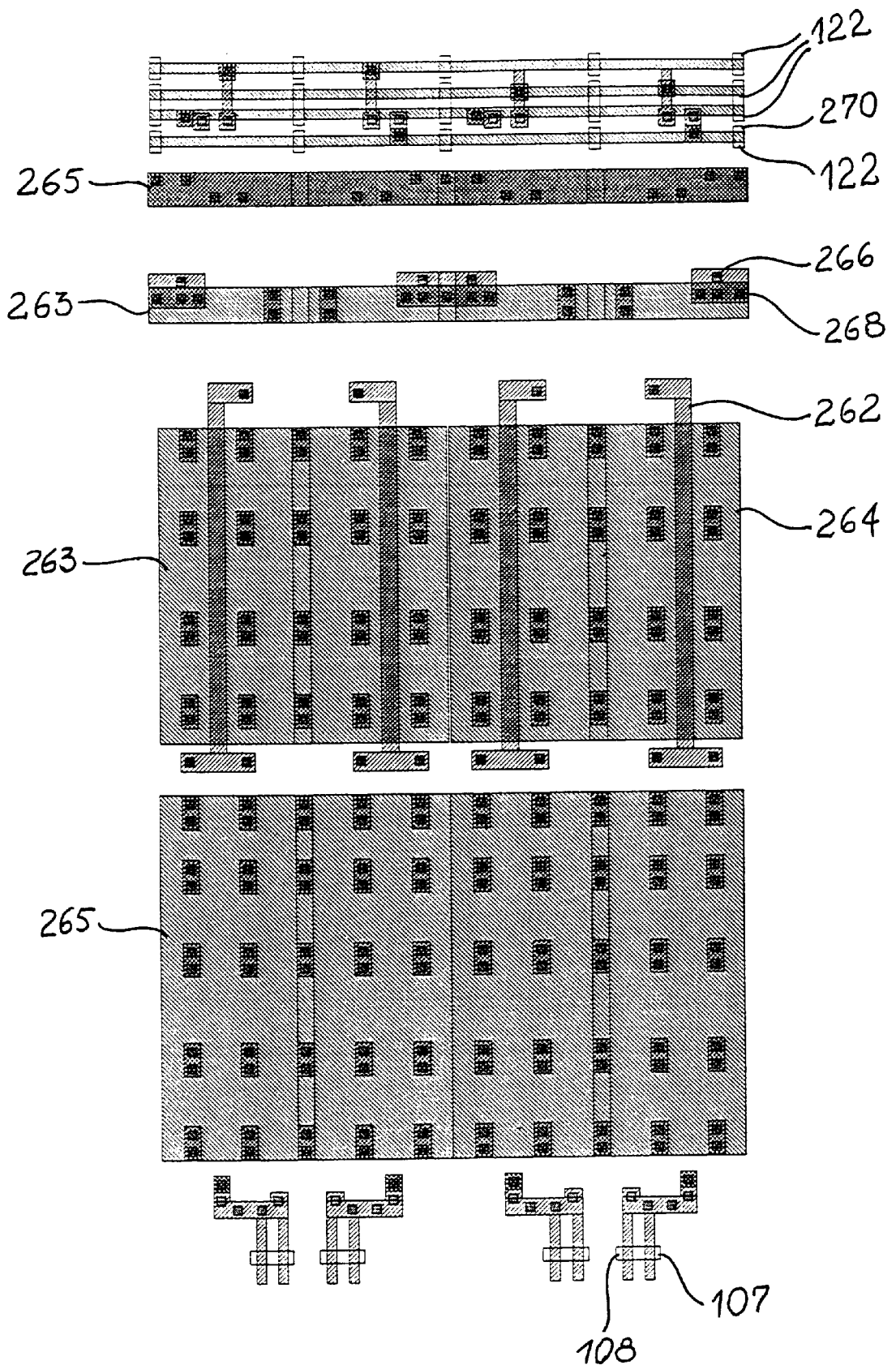

Reference is now made to FIGS. 6A and 6B, which together illustrate portions of a preferred layout corresponding to the circuitry of either FIG. 4B or FIG. 4C, wherein FIG. 6A is a simplified illustration of the layout of a non-customizable CMOS structure up to and including a first metal layer, and FIG. 6B is a simplified illustration of a layout of customizable second and third metal layers formed over the structure shown in FIG. 6A including customizable links.

In FIG. 6A, the diffusion layer is indicated by reference numeral 250; the polysilicon layer is indicated by reference numeral 252. The metal 1 layer is indicated by reference numeral 254. Contacts are indicated by reference numerals 256 and via 1s, by reference numerals 258. The general locations of customization links are indicated by reference numerals 260 generally.

In FIG. 6B, the metal 2 layer is indicated by reference numeral 262 and the metal 3 layer is indicated by reference numeral 263. Metal 3 VDD lines are indicated specifically by reference numeral 264 and the metal 3 VSS lines are indicated specifically by reference numeral 265. Via 1s are indicated by reference numerals 266 and via 2s, by reference numerals 268. The general location of customization links are indicated by reference numerals 270 generally, the specific links referred to above in connection with FIGS. 4A–4C, being indicated by identical reference numerals in FIG. 6B.

Figure 7A:
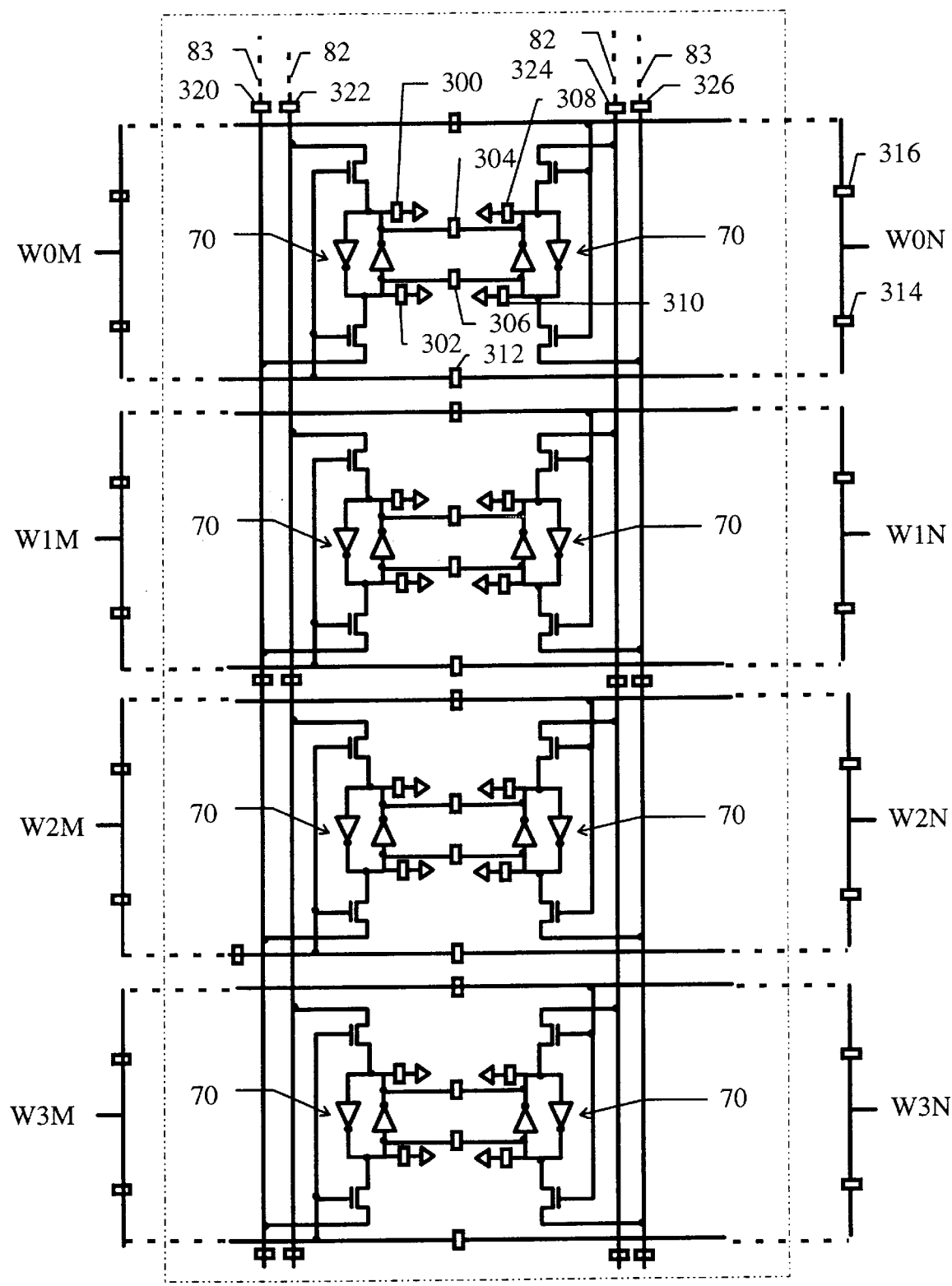
FIGS. 7A, 7B and 7C are simplified illustrations of the portions shown in respective FIGS. 4A, 4B and 4C customized to provide a 4 word by 2bit single port RAM.
Figure 7B:
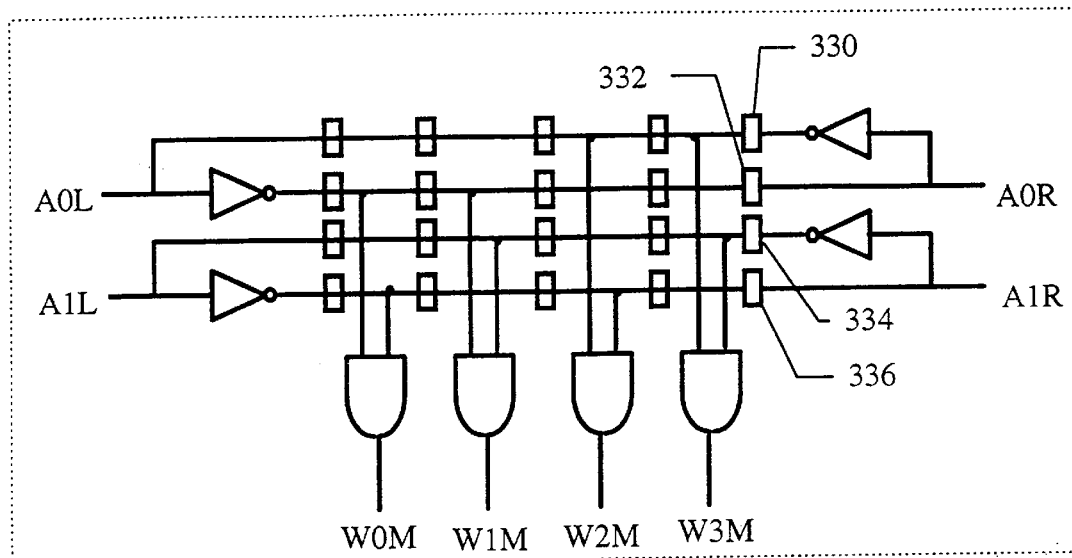
Figure 7C:
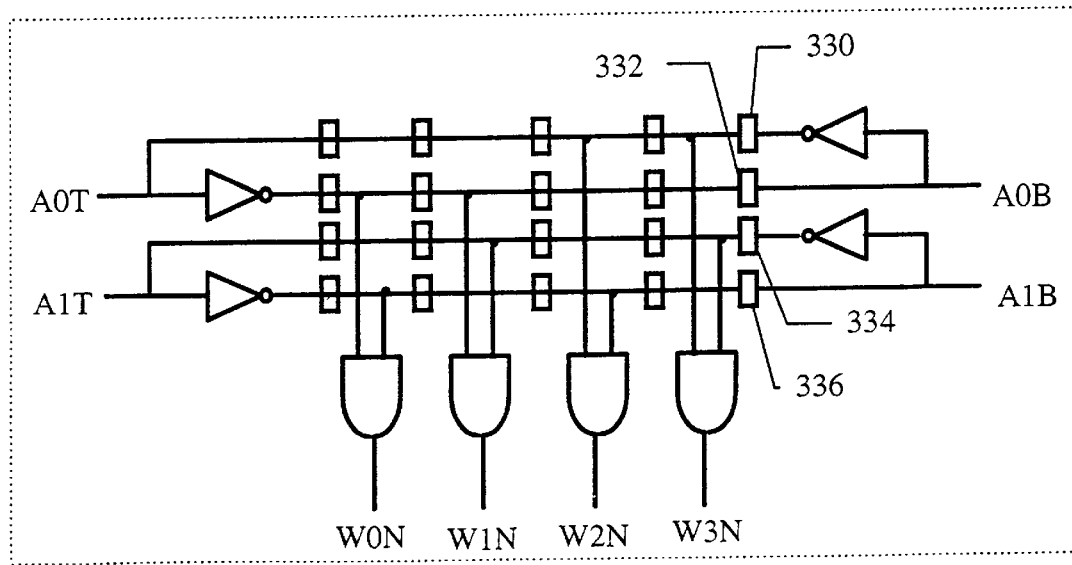

Reference is now made to FIGS. 7A, 7B and 7C, which are simplified illustrations of the portions shown in respective FIGS. 4A, 4B and 4C customized by laser ablation, etching or customized metal deposition to produce a 4 word by 2 bit single port RAM.

It is seen in FIG. 7A that links 300, 302, 304, 306, 308, 310, 312, 314 and 316 in each pair of adjacent cells are cut. Additionally links 320, 322, 324 and 326 along bit lines 82 and 83 are also cut.

In FIGS. 7B and 7C links 330, 332, 334 and 336 are cut, it being appreciated that the decoder of FIG. 7C is redundant, its inputs having a fixed value. The decoder of FIG. 7B constitutes the X decoder for the embodiment of FIG. 7A.

Figure 8:
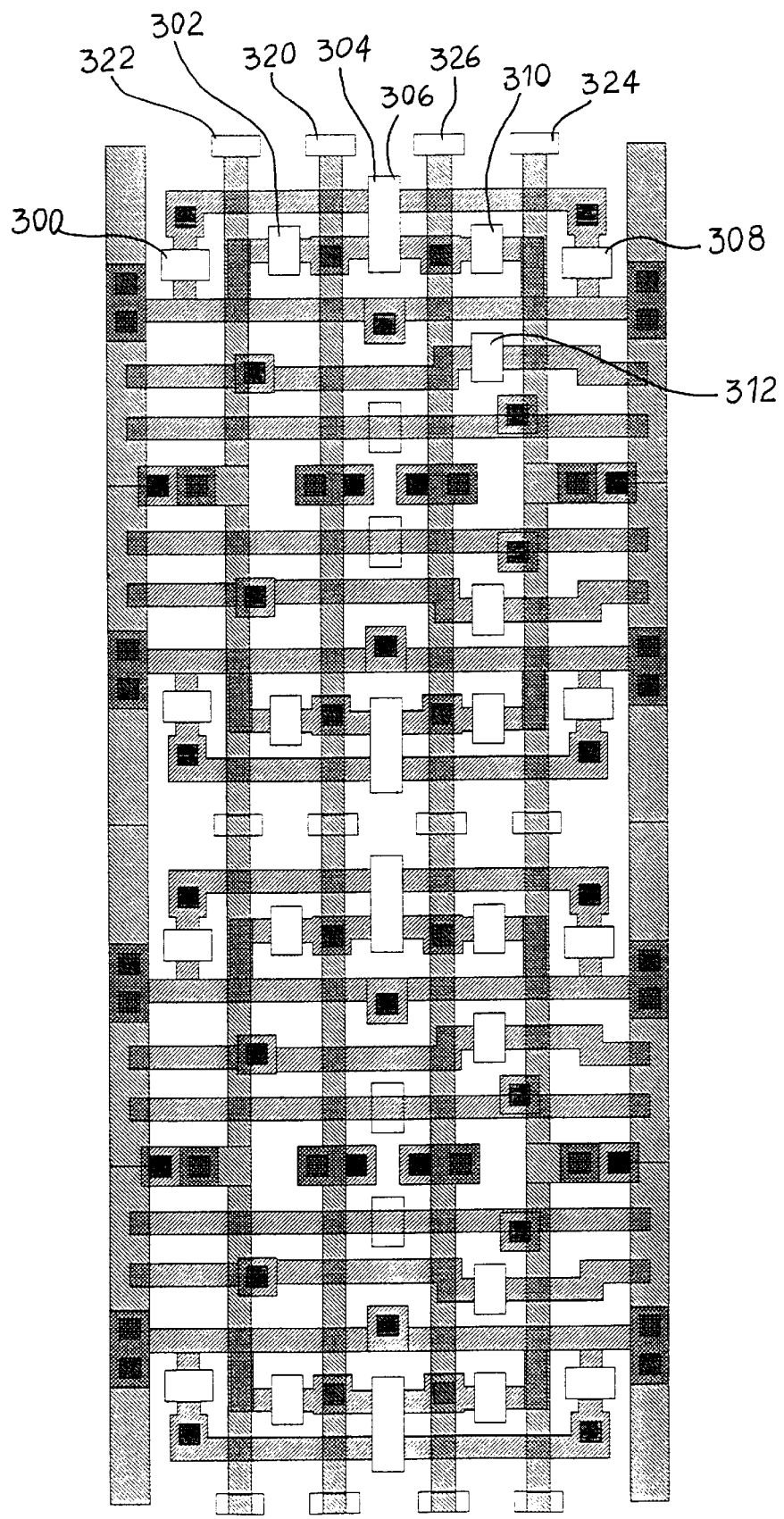
FIG. 8 is an illustration of the layout of FIG. 5B, following customization by laser ablation, etching or customized metal deposition to produce the memory portion of a 4 word by 2 bit single port RAM.

Reference is now made to FIG. 8, which is an illustration of the layout of FIG. 5B, following customization by laser ablation, etching or customized metal deposition to produce the memory portion of a 4 word by 2 bit single port RAM. The cut links are identified by the same reference numerals employed in FIG. 7A.

Figure 9A:
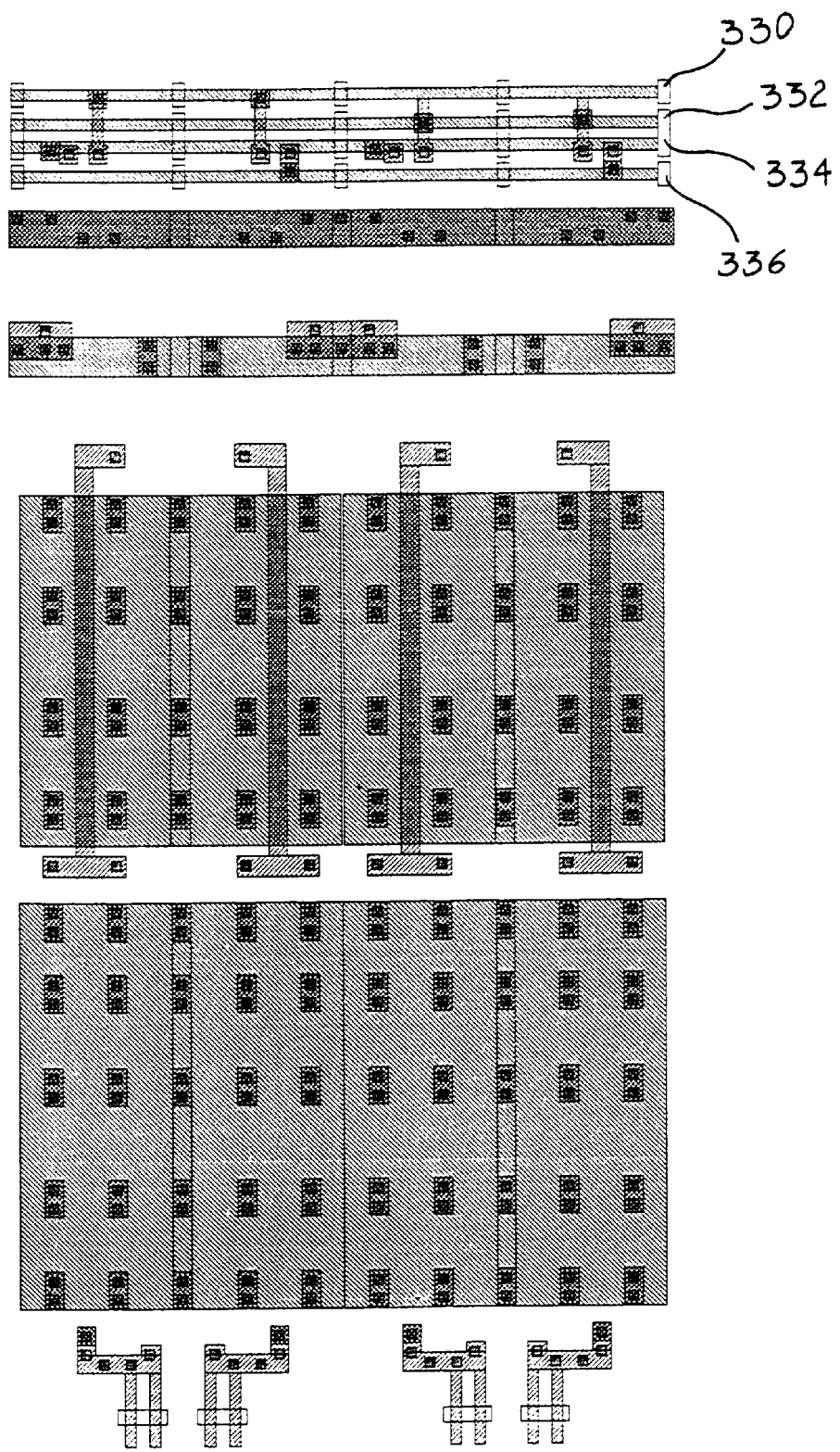
FIGS. 9A and 9B are illustrations of the layout of FIG. 6B, following customization by laser ablation, etching or customized metal deposition to produce a decoder portion of a 4 word by 2 bit single port RAM corresponding to the circuitry of FIGS. 4B and 4C respectively.
Figure 9B:
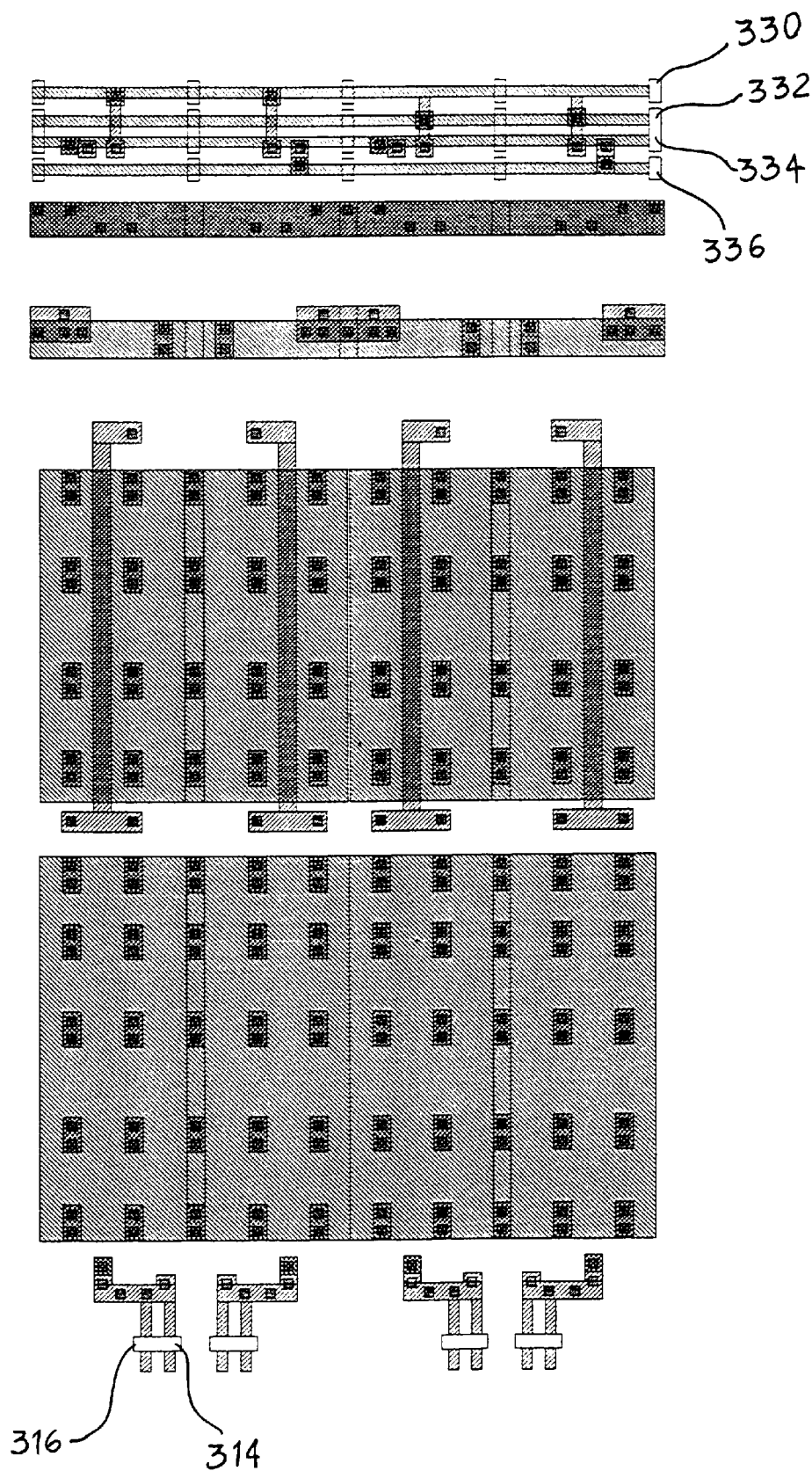

Reference is now made to FIGS. 9A and 9B, which are illustrations of the layout of FIG. 6B, following customization by laser ablation, etching or customized metal deposition to produce a decoder portion of a 4 word by 2 bit single port RAM.

FIG. 9A illustrates a decoder corresponding to the circuitry of FIG. 7B. The cut links are identified by the same reference numerals employed in FIG. 7B.

FIG. 9B illustrates a redundant decoder corresponding to the circuitry of FIG. 7C. The cut links 330, 332, 334 and 336 are identified by the same reference numerals employed in FIG. 7C. The cut links 314 and 316 are identified by the same reference numerals employed in FIG. 7A.

Figure 10A:
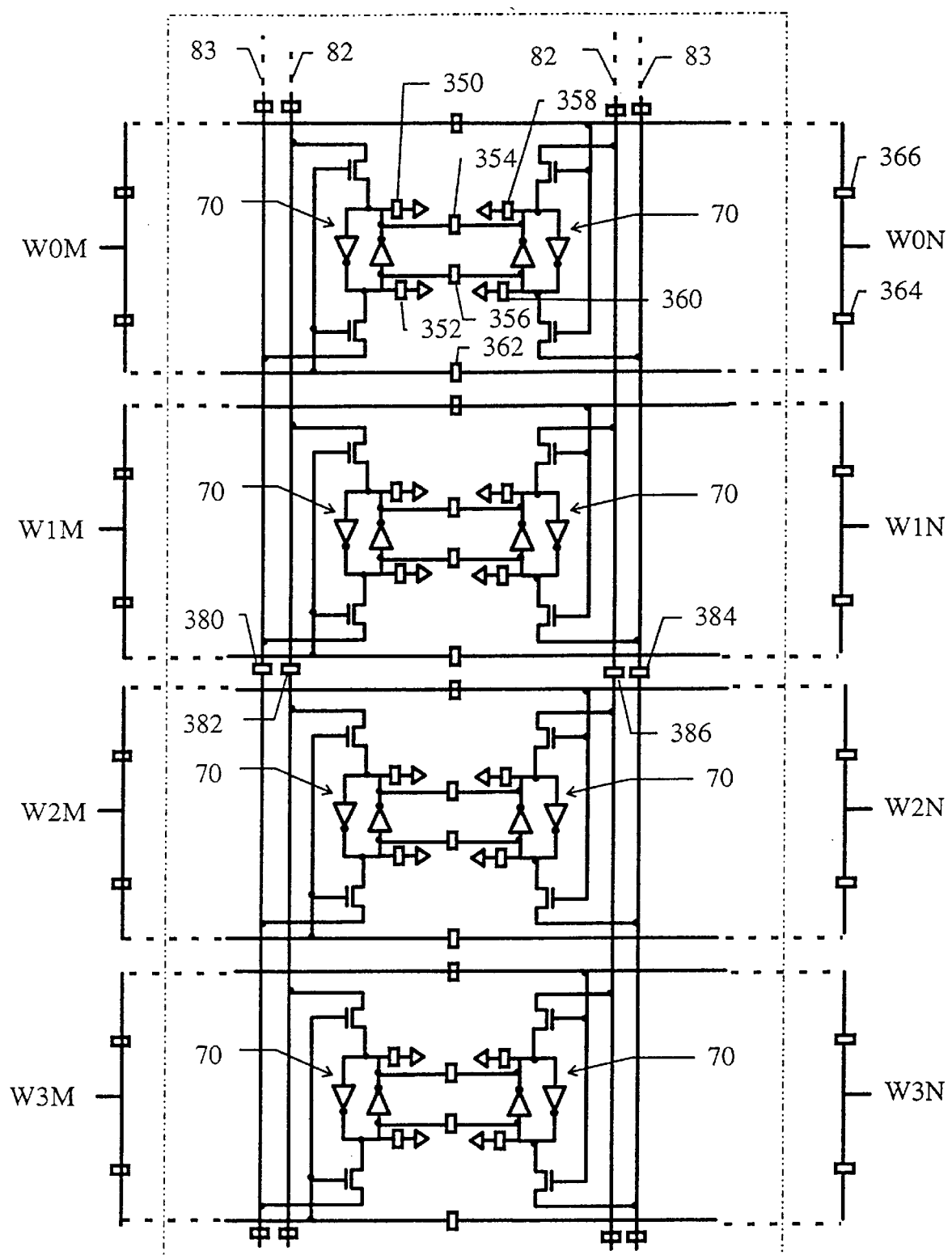
FIGS. 10A, 10B and 10C are simplified illustrations of the portions shown in respective FIGS. 4A, 4B and 4C customized to provide two 2 word by 2 bit single port RAMs.
Figure 10B:
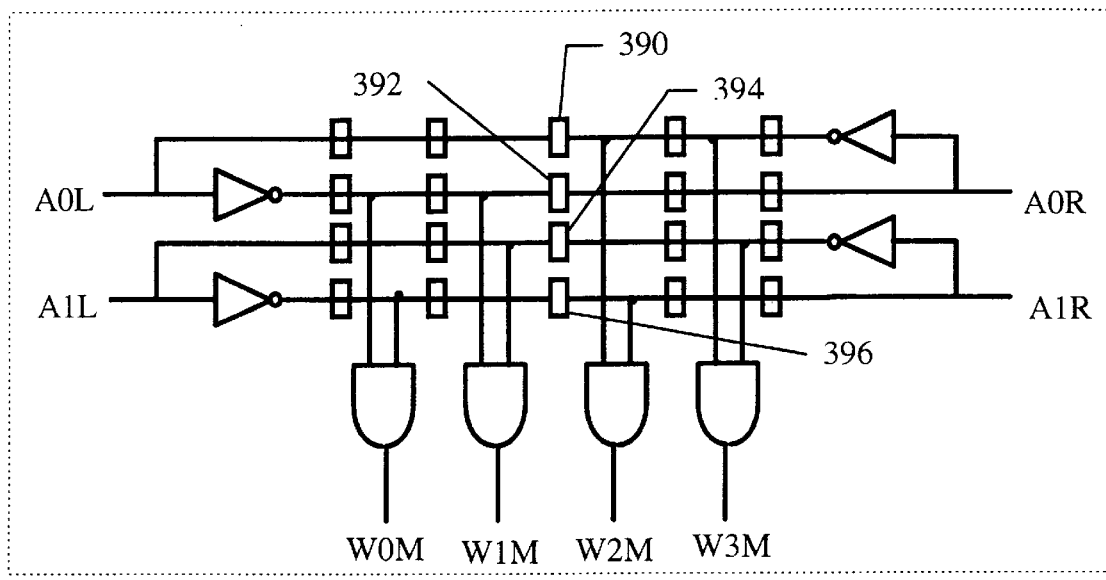
Figure 10C:
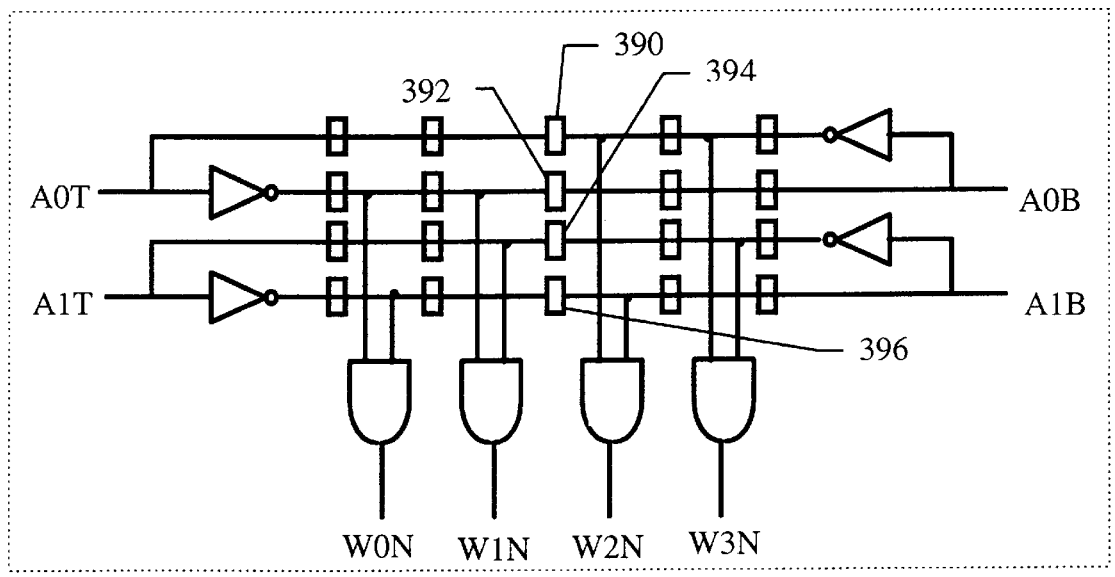

Reference is now made to FIGS. 10A, 10B and 10C, which are simplified illustrations of the portions shown in respective FIGS. 4A, 4B and 4C customized by laser ablation, etching or customized metal deposition to produce two 2 word by 2 bit single port RAMs.

It is seen in FIG. 10A that links 350, 352, 354, 356, 358, 360, 362, 364 and 366 in each pair of adjacent cells are cut. Additionally links 380, 382, 384 and 386 along bit lines 82 and 83 are also cut to separate pairs of adjacent RAM cells 70 to define separate RAMs.

In FIGS. 10B and 10C links 390, 392, 394 and 396 are cut, it being appreciated that the decoder of FIG. 10C is redundant, its inputs having a fixed value. The decoder of FIG. 10B constitutes two X decoders for the embodiment of FIG. 10A.

Figure 11:
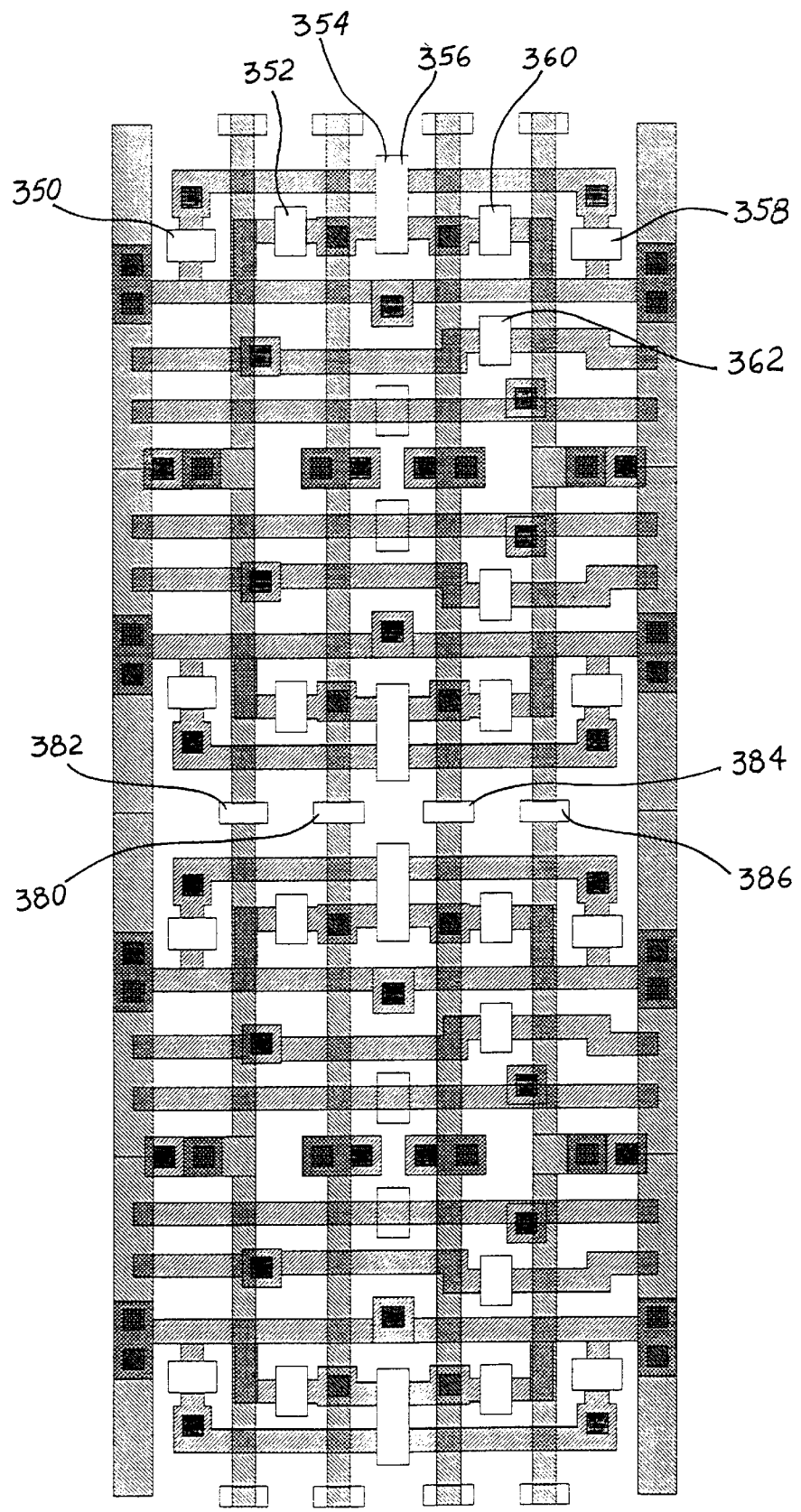
FIG. 11 is an illustration of the layout of FIG. 5B, following customization by laser ablation, etching or customized metal deposition to produce the memory portion of two 2 word by 2 bit single port RAMs.

Reference is now made to FIG. 11, which is an illustration of the layout of FIG. 5B, following customization by laser ablation, etching or customized metal deposition to produce the memory portion of two 2 word by 2 bit single port RAMs. The cut links are identified by the same reference numerals employed in FIG. 10A.

Figure 12A:
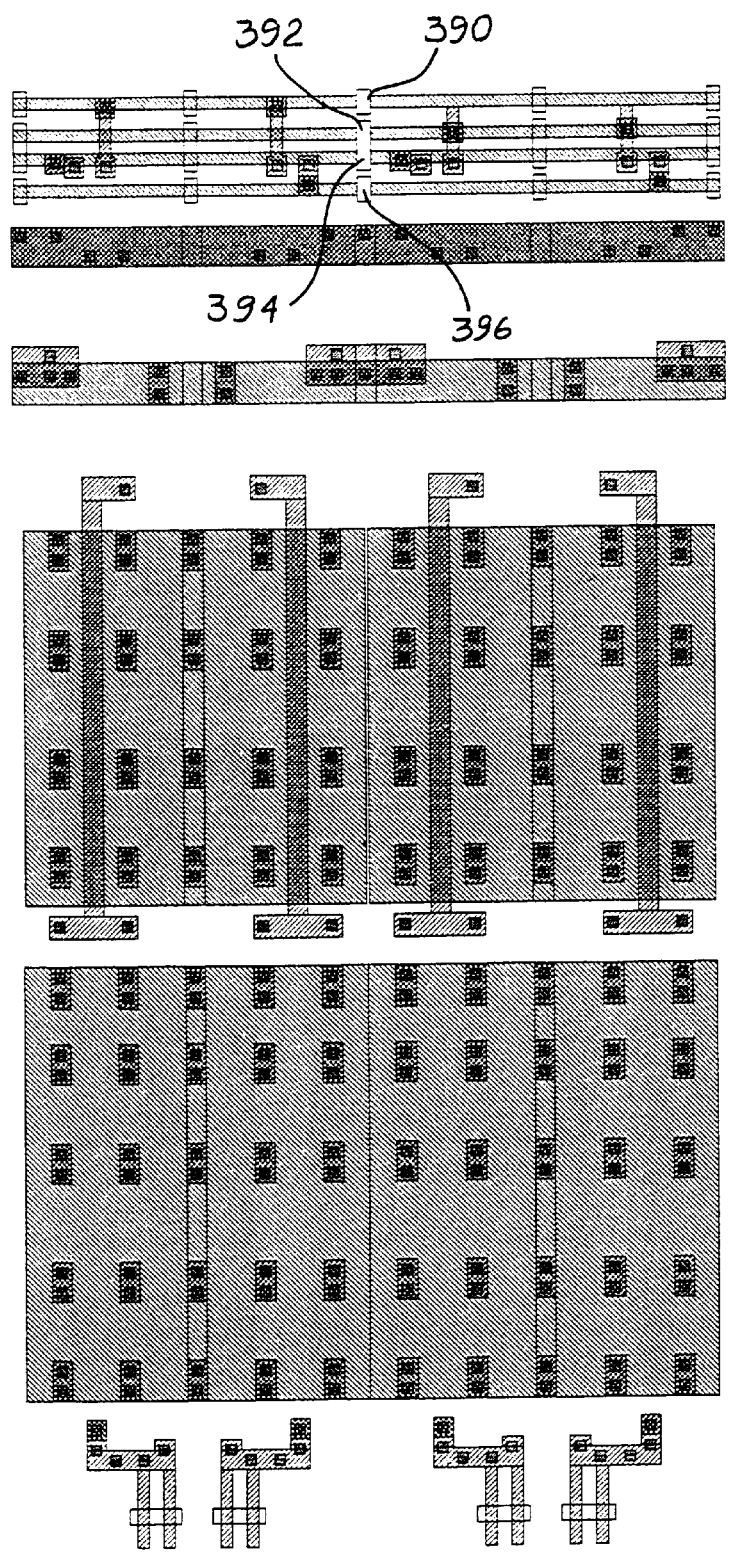
FIGS. 12A and 12B are illustrations of the layout of FIG. 6B, following customization by laser ablation, etching or customized metal deposition to produce a decoder portion of a two 2 word by 2 bit single port RAMs corresponding to the circuitry of FIGS. 4B and 4C respectively.
Figure 12B:
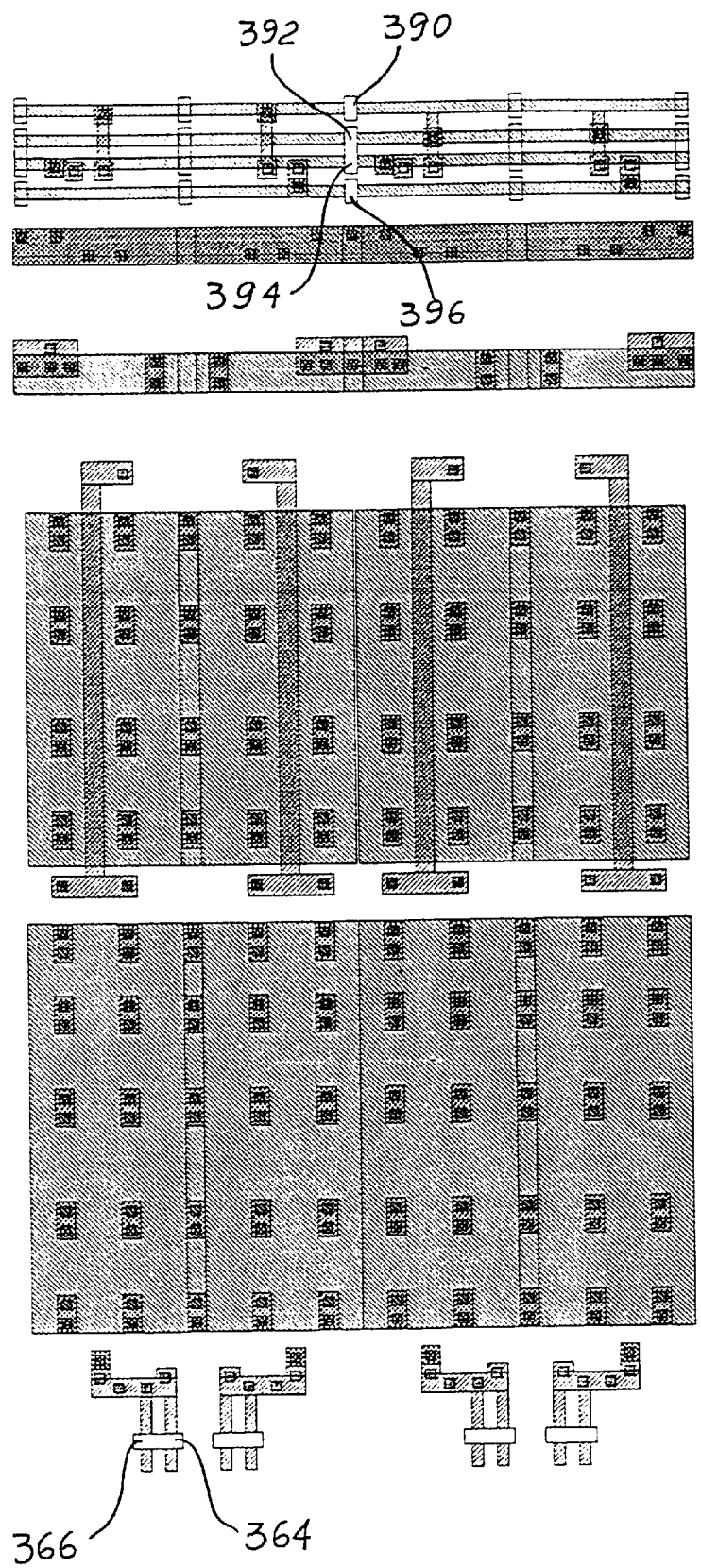

Reference is now made to FIGS. 12A and 12B, which are illustrations of the layout of FIG. 6B, following customization by laser ablation, etching or customized metal deposition to produce a decoder portion of two 2 word by 2 bit single port RAMs.

FIG. 12A illustrates a decoder corresponding to the circuitry of FIG. 10B. The cut links are identifies by the same reference numerals employed in FIG. 10B.

FIG. 12B illustrates a redundant decoder corresponding to the circuitry of FIG. 10C. The cut links 390, 392, 394 and 396 are identified by the same reference numerals employed in FIG. 10C. The cut links 364 and 366 are identified by the same reference numerals employed in FIG. 10A.

Figure 13A:
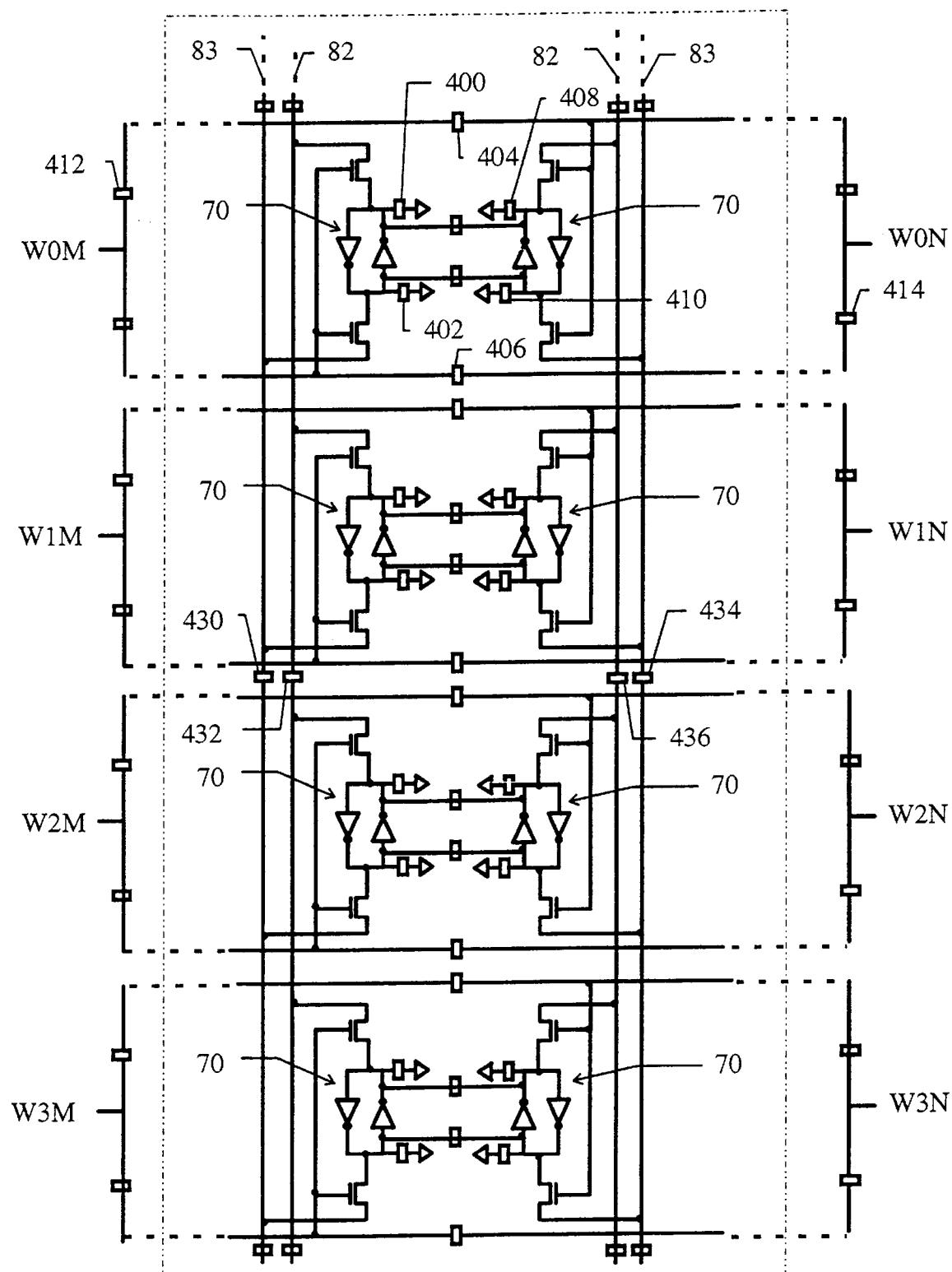
FIGS. 13A, 13B and 13C are simplified illustrations of the portions shown in respective FIGS. 4A, 4B and 4C customized to provide two 2 word by 1 bit dual-port RAMs.
Figure 13B:
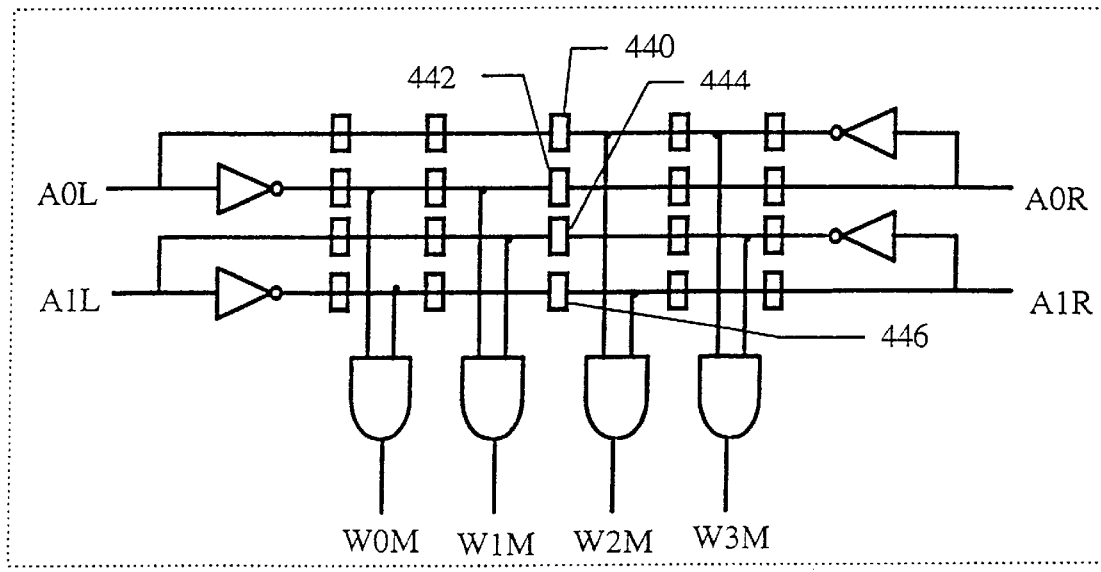
Figure 13C:
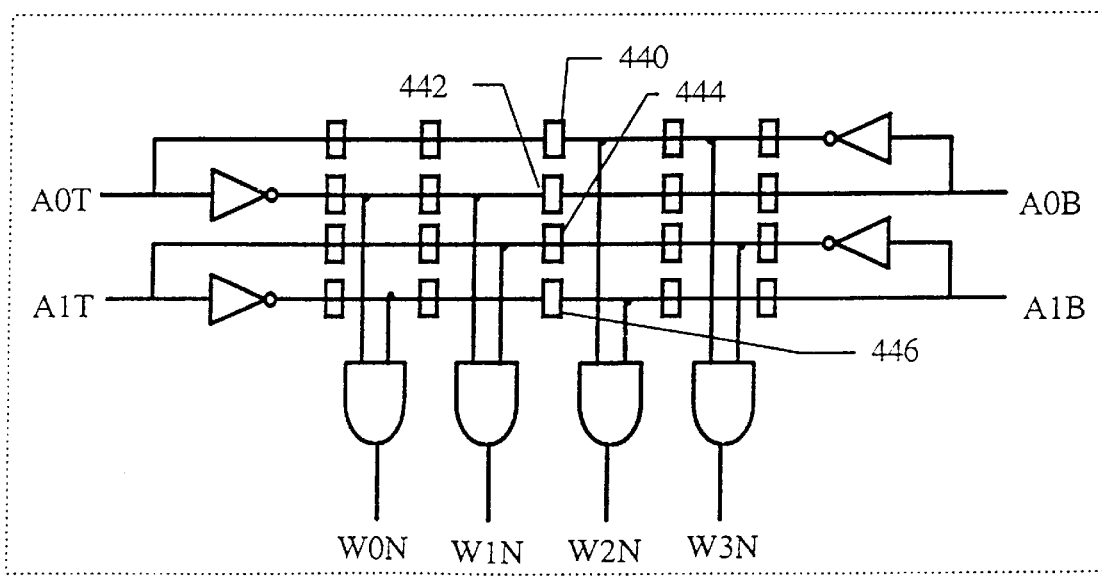

Reference is now made to FIGS. 13A, 13B and 13C, which are simplified illustrations of the portions shown in respective FIGS. 4A, 4B and 4C customized by laser ablation etching or customized metal deposition to produce two 2 word by 1 bit dual-port RAMs.

It is seen in FIG. 13A that links 400, 402, 404, 406, 408, 410, 412 and 414 in each pair of adjacent cells are cut. Additionally links 430, 432, 434 and 436 along bit lines 82 and 83 are also cut to separate pairs of adjacent RAM cells 70 to define separate RAMs.

In FIGS. 13B and 13C links 440, 442, 444 and 446 are cut, each decoder functioning as two separate decoders.

Figure 14:
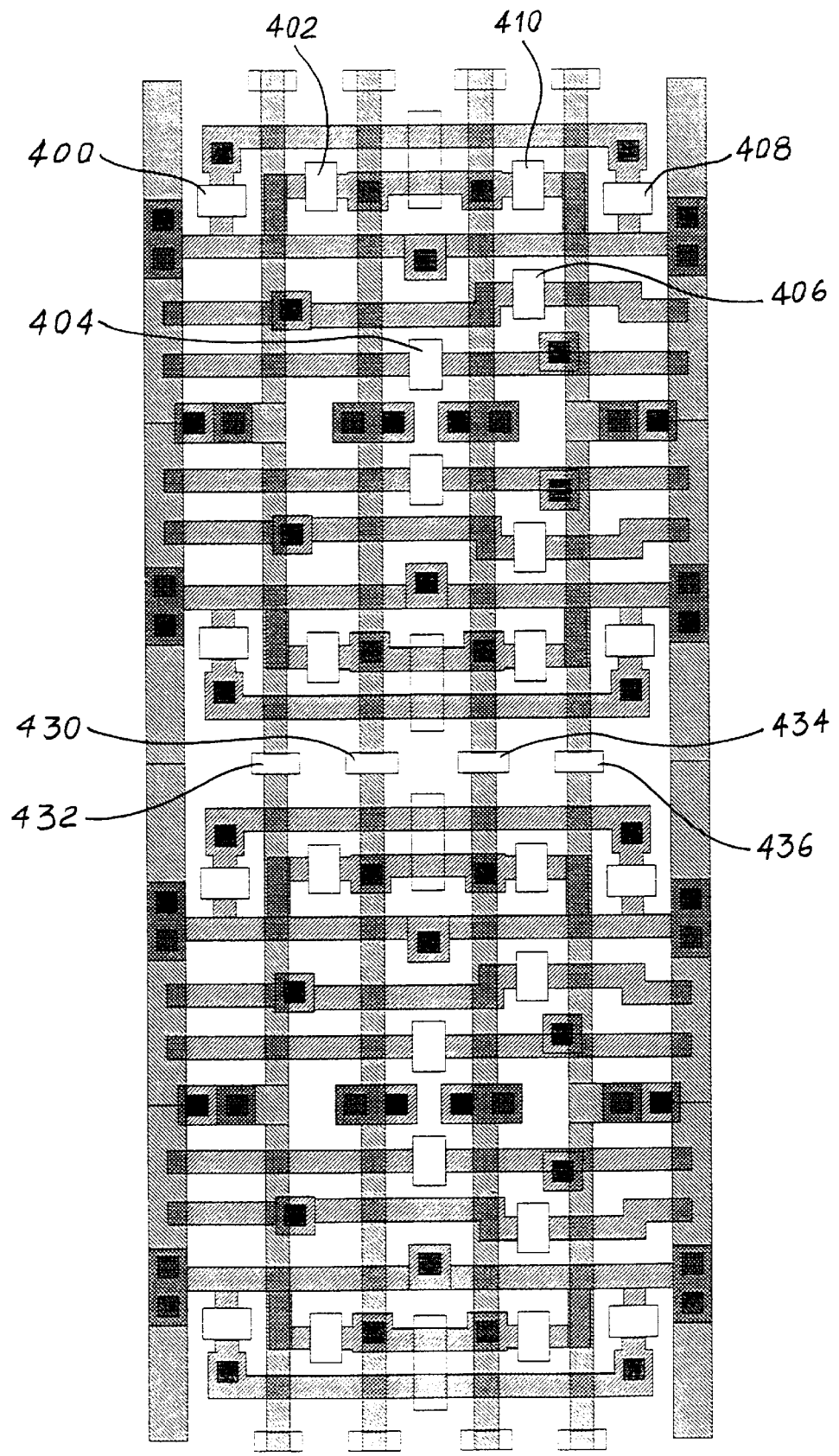
FIG. 14 is an illustration of the layout of FIG. 5B, following customization by laser ablation, etching or customized metal deposition to produce the memory portion of two 2 word by 1 bit dual-port RAMs.

Reference is now made to FIG. 14, which is an illustration of the layout of FIG. 5B, following customization by laser ablation, etching or customized metal deposition to produce the memory portion of two 2 word by 1 bit dual-port RAMs. The cut links are identified by the same reference numerals employed in FIG. 13A.

Figure 15A:
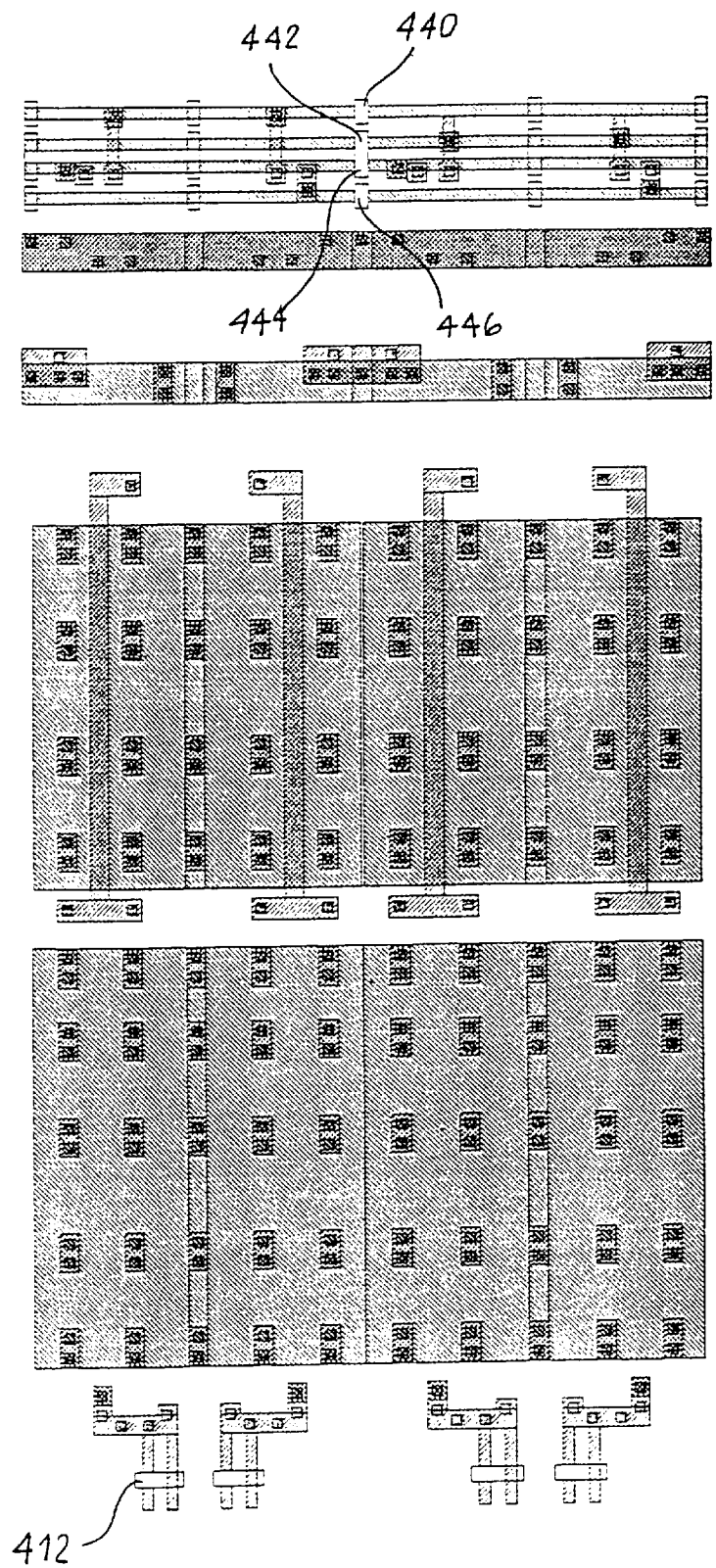
FIGS. 15A and 15B are illustrations of the layout of FIG. 6B, following customization by laser ablation, etching or customized metal deposition to produce a decoder portion of two 2 word by 1 bit dual-port RAMs corresponding to the circuitry of FIGS. 4B and 4C respectively.
Figure 15B:
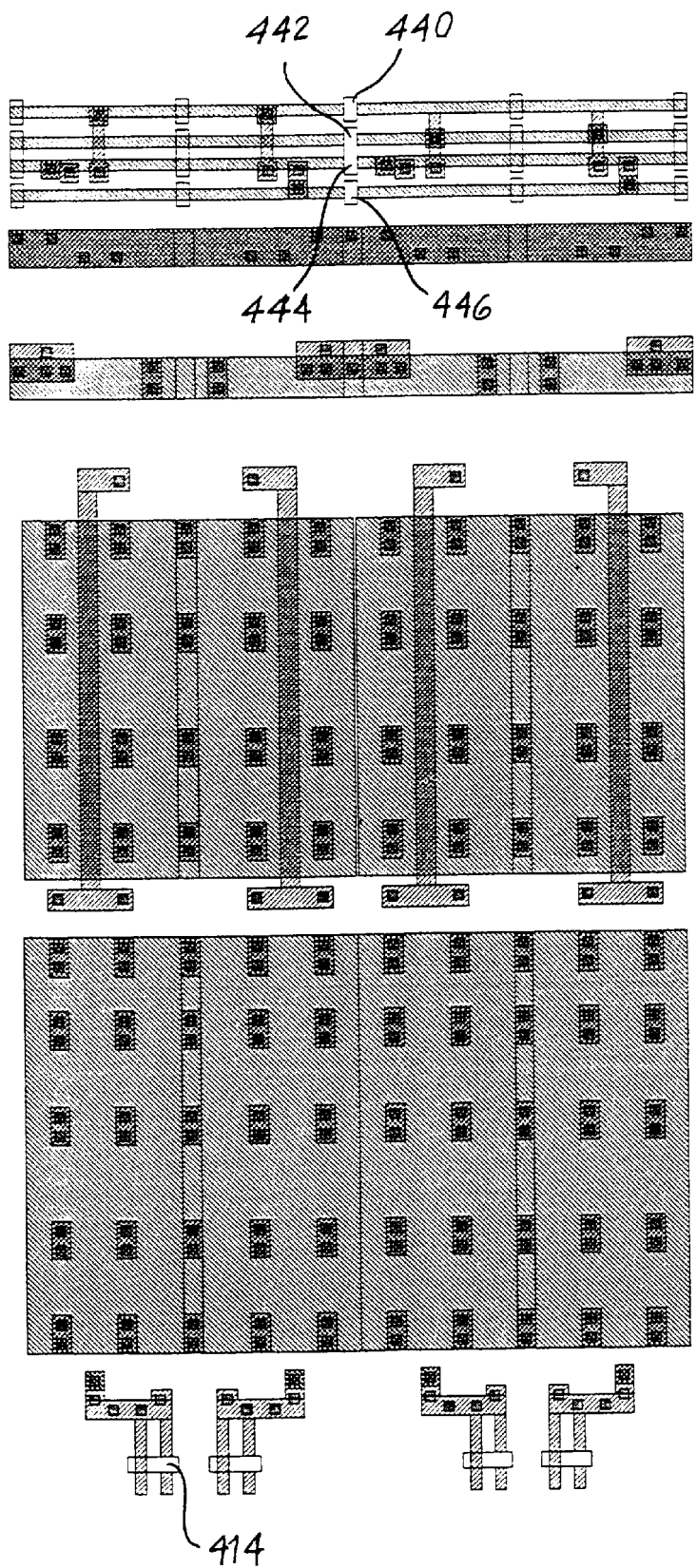

Reference is now made to FIGS. 15A and 15B, which are illustrations of the layout of FIG. 6B, following customization by laser ablation, etching or customized metal deposition to produce decoders for the two 2 word by 1 bit dual-port RAMs. Two decoders having the configuration shown in FIG. 6B are employed, one part of each decoder being used with each port of the two dual-port RAMs.

FIG. 15A illustrates a decoder corresponding to the circuitry of FIG. 13B. The cut links 440, 442, 444 and 446 are identified by the same reference numerals employed in FIG. 13B. The cut link 412 is identified by the same reference numeral employed in FIG. 13A.

FIG. 15B illustrates a decoder corresponding to the circuitry of FIG. 13C. The cut links 440, 442, 444 and 446 are identified by the same reference numerals employed in FIG. 13C. The cut link 414 is identified by the same reference numeral employed in FIG. 13A.

Figure 16A:
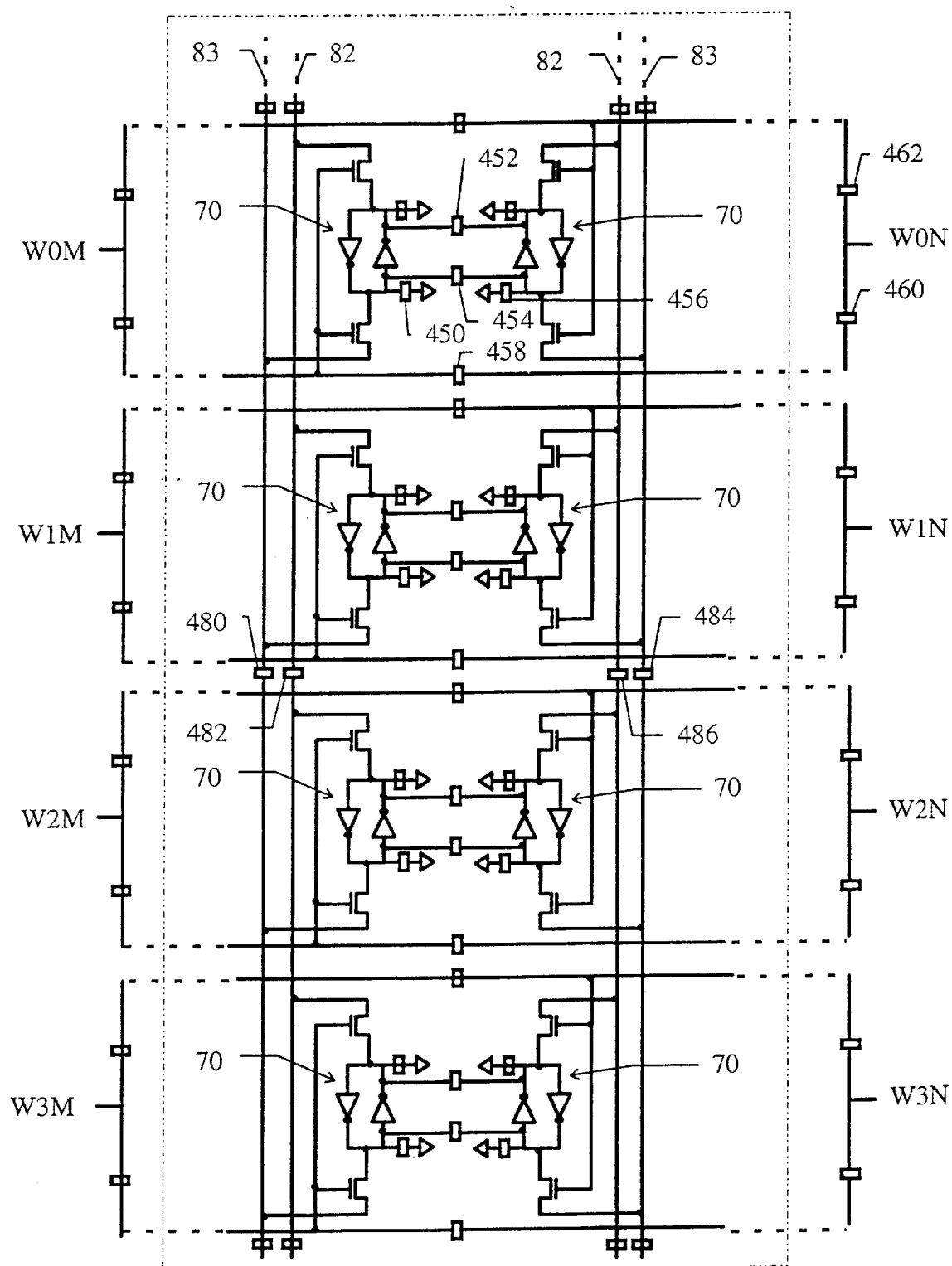
FIGS. 16A, 16B and 16C are simplified illustrations of the portions shown in respective FIGS. 4A, 4B and 4C customized to provide two 2 word by 2 bit ROMs.
Figure 16B:
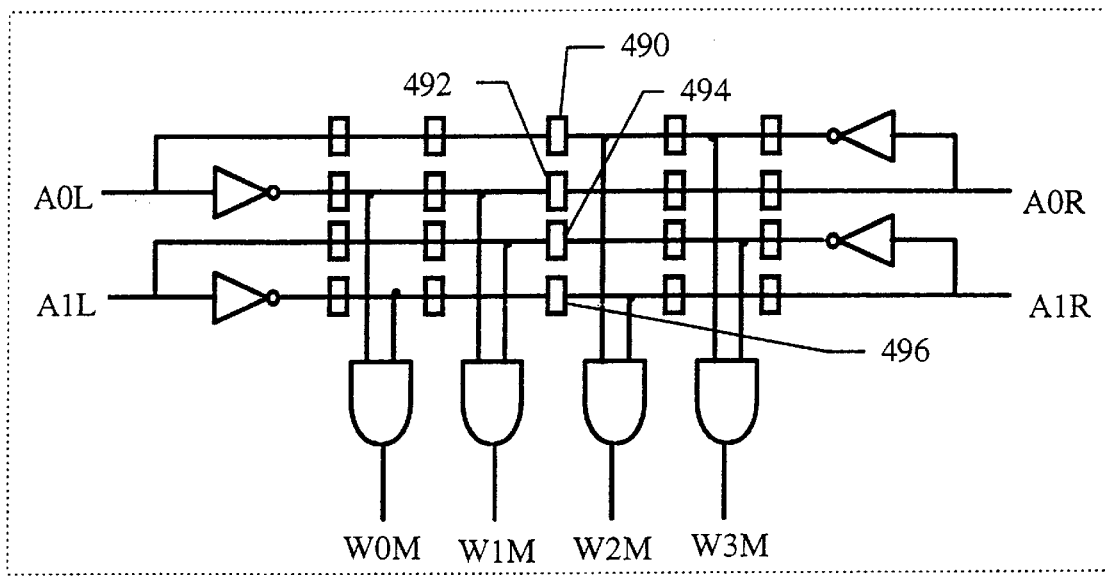
Figure 16C:
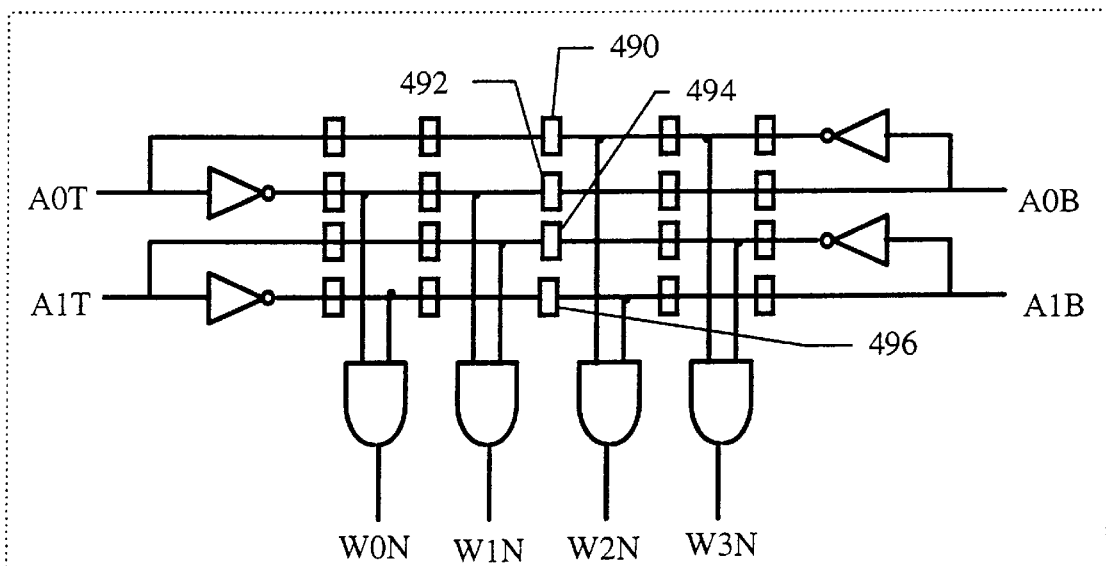

Reference is now made to FIGS. 16A, 16B and 16C, which are simplified illustrations of the portions shown in respective FIGS. 4A, 4B and 4C customized by laser ablation, etching or customized metal deposition to produce two 2 word by 2 bit ROMs.

It is seen in FIG. 16A that links 450, 452, 454, 456, 458, 460 and 462 in each pair of adjacent cells are cut. Additionally links 480, 482, 484 and 486 along bit lines 82 and 83 are also cut to separate pairs of adjacent RAM cells 70 to define separate ROMs.

In FIGS. 16B and 16C links 490, 492, 494 and 496 are cut, it being appreciated that the decoder of FIG. 16C is redundant, its inputs having a fixed value. The decoder of FIG. 16B constitutes two X decoders for the embodiment of FIG. 16A.

Figure 17:
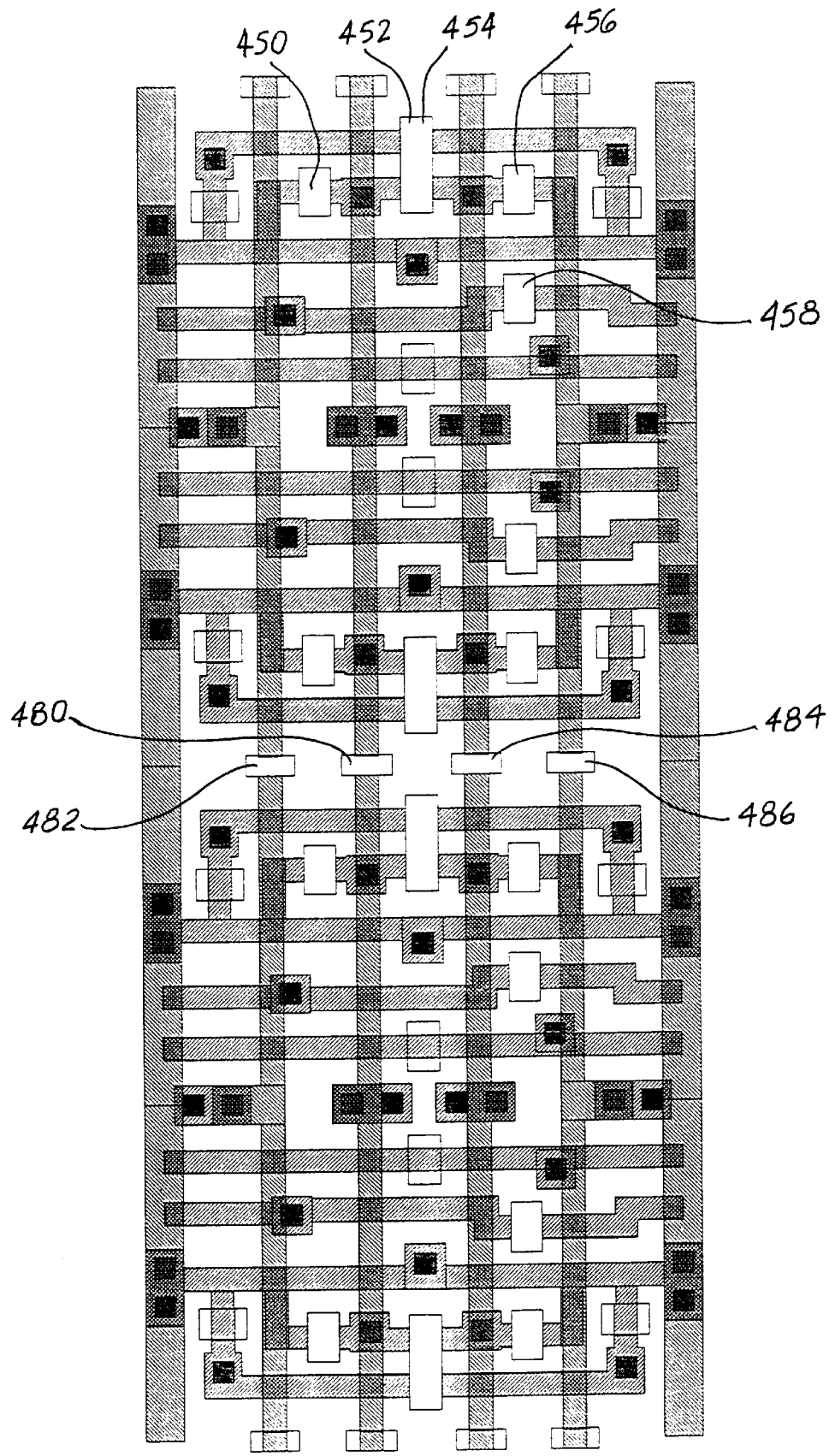
FIG. 17 is an illustration of the layout of FIG. 5B, following customization by laser ablation, etching or customized metal deposition to produce the memory portion of two 2 word by 2 bit ROMs.

Reference is now made to FIG. 17, which is an illustration of the layout of FIG. 5B, following customization by laser ablation, etching or customized metal deposition to produce the memory portion of two 2 word by 2 bit ROMs. The cut links are identified by the same reference numerals employed in FIG. 16A.

Figure 18A:
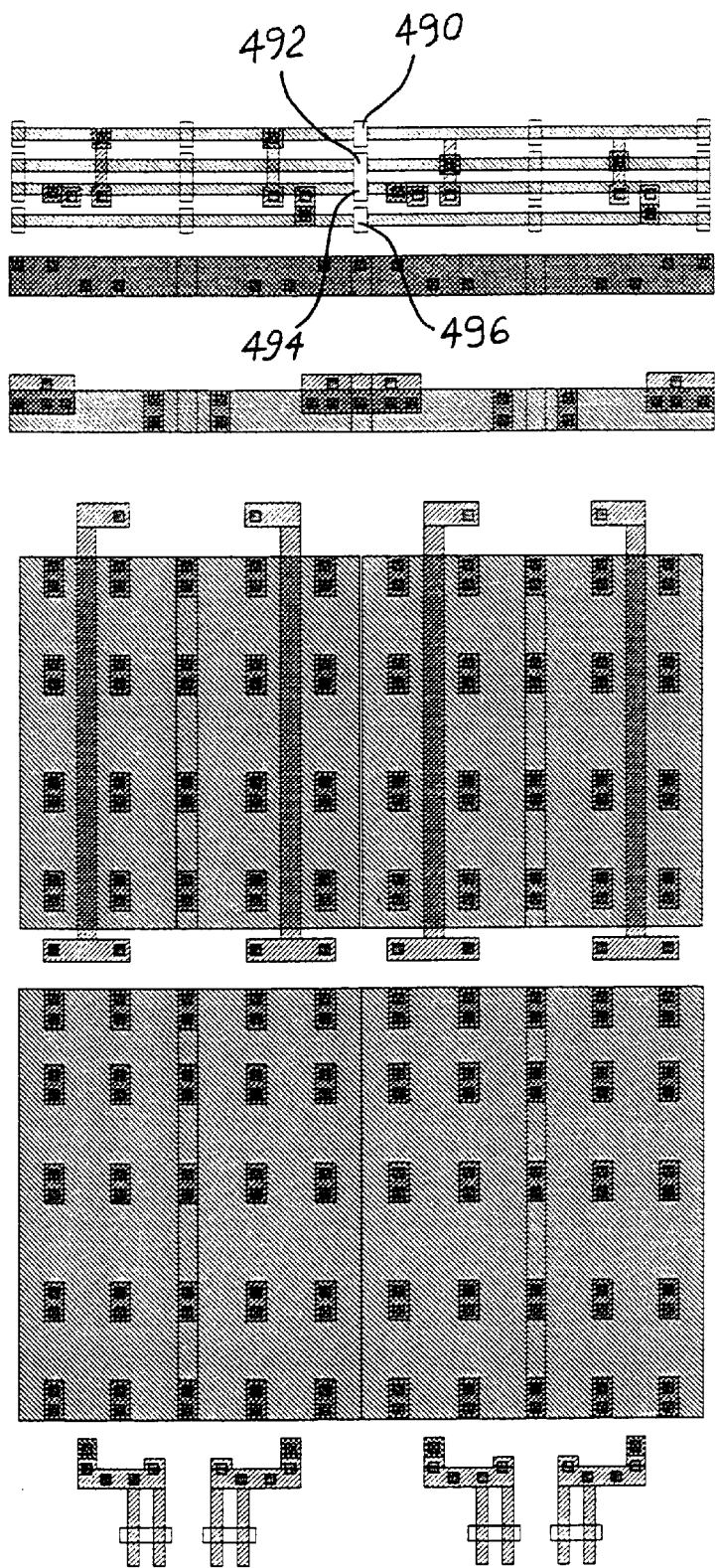
FIGS. 18A and 18B are illustrations of the layout of FIG. 6B, following customization by laser ablation, etching or customized metal deposition to produce a decoder portion of two 2 word by 2 bit ROMs corresponding to the circuitry of FIGS. 4B and 4C respectively.
Figure 18B:
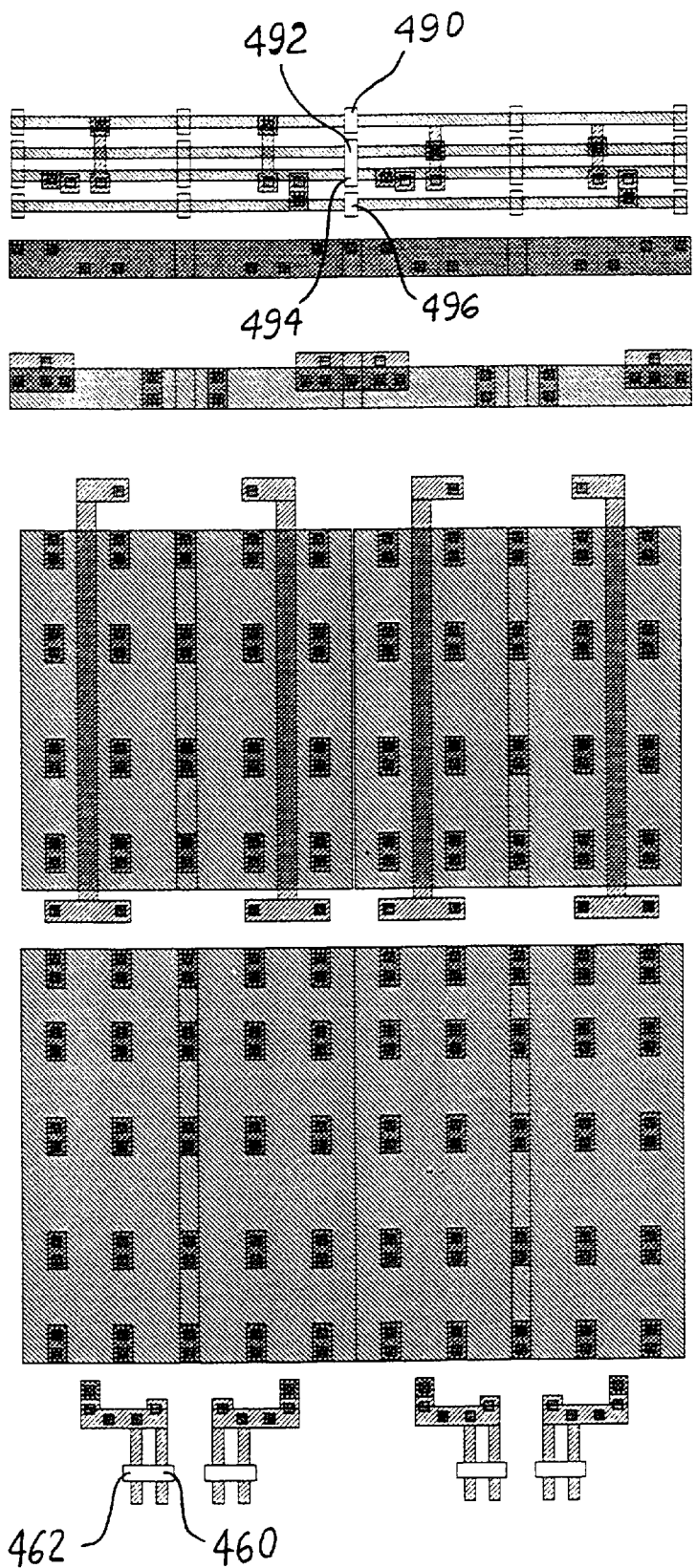

Reference is now made to FIGS. 18A and 18B, which are an illustration of the layout of FIG. 6B, following customization by laser ablation, etching or customized metal deposition to produce a decoder portion of two 2 word by 2 bit ROMs.

FIG. 18A illustrates a decoder corresponding to the circuitry of FIG. 16B. The cut links are identified by the same reference numerals employed in FIG. 16B.

FIG. 18B illustrates a redundant decoder corresponding to the circuitry of FIG. 16C. The cut links 490, 492, 494 and 496 are identified by the same reference numerals employed in FIG. 16C. The cut links 460 and 462 are identified by the same reference numerals employed in FIG. 16A.

Figure 19A:
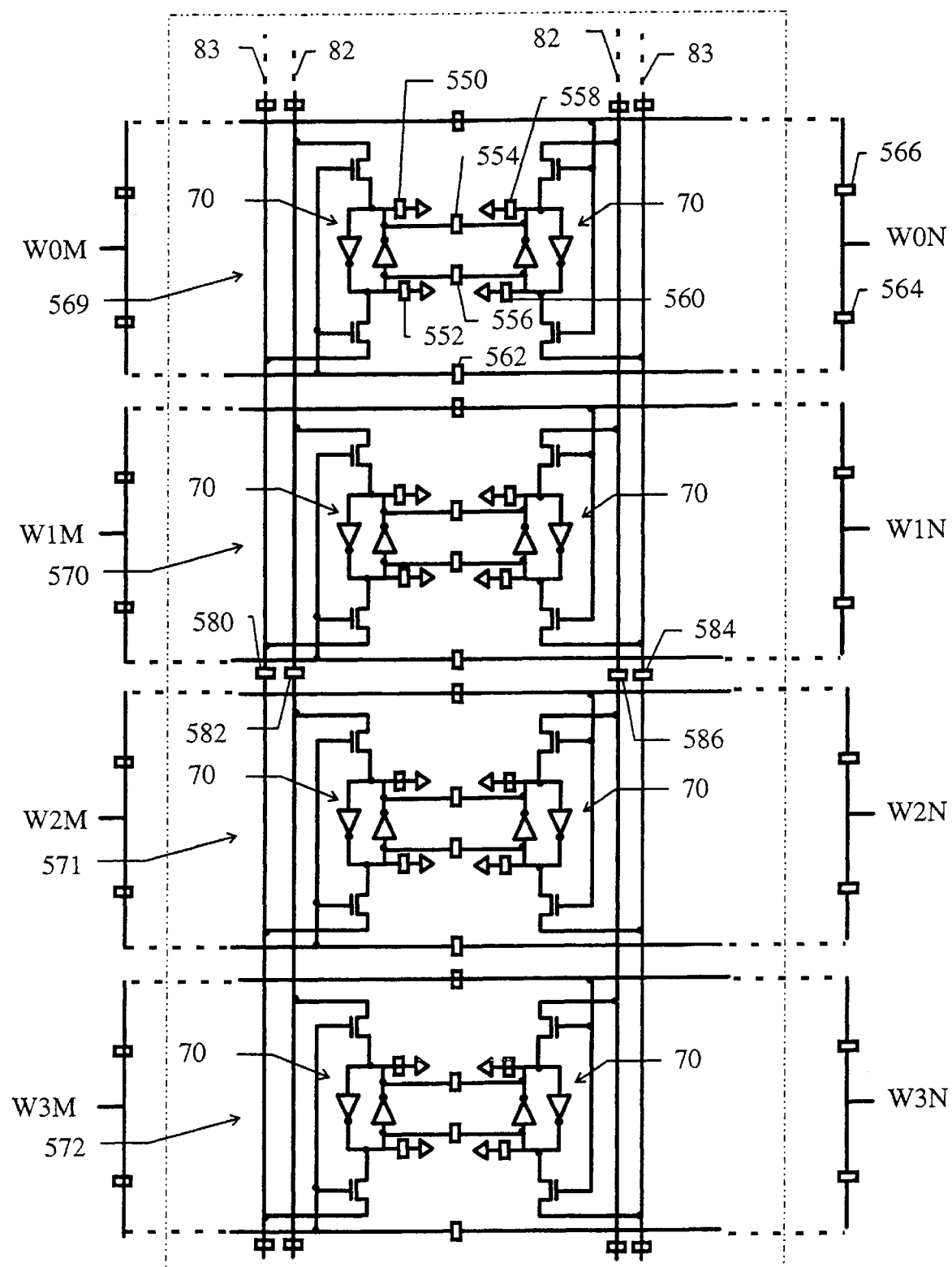
FIGS. 19A, 19B and 19C are simplified illustrations of the portions shown in respective FIGS. 4A, 4B and 4C customized to provide a 2 word by 2 bit single port RAM and a 2 word by 2 bit ROM.
Figure 19B:
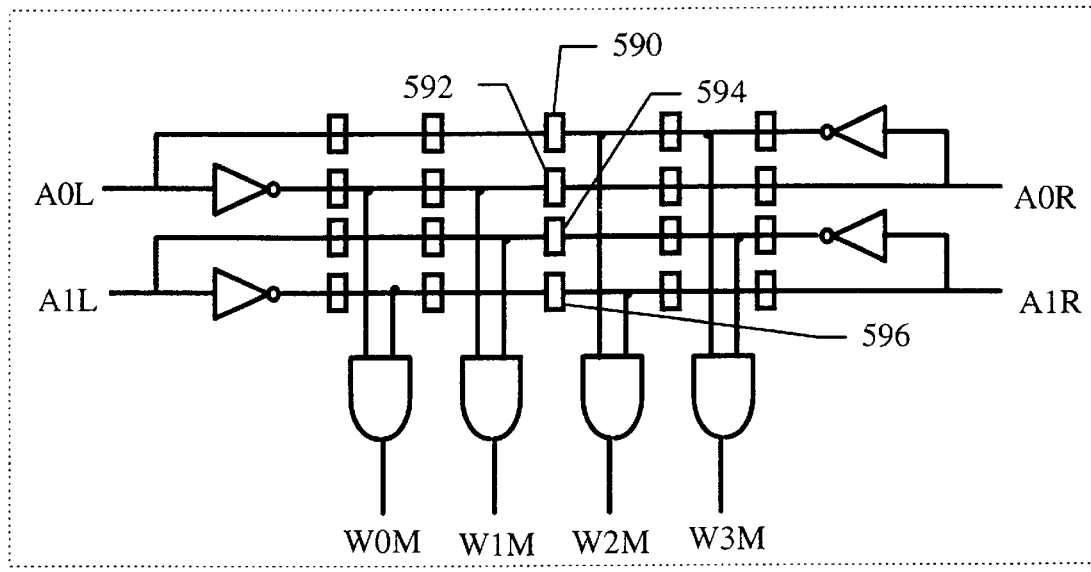
Figure 19C:
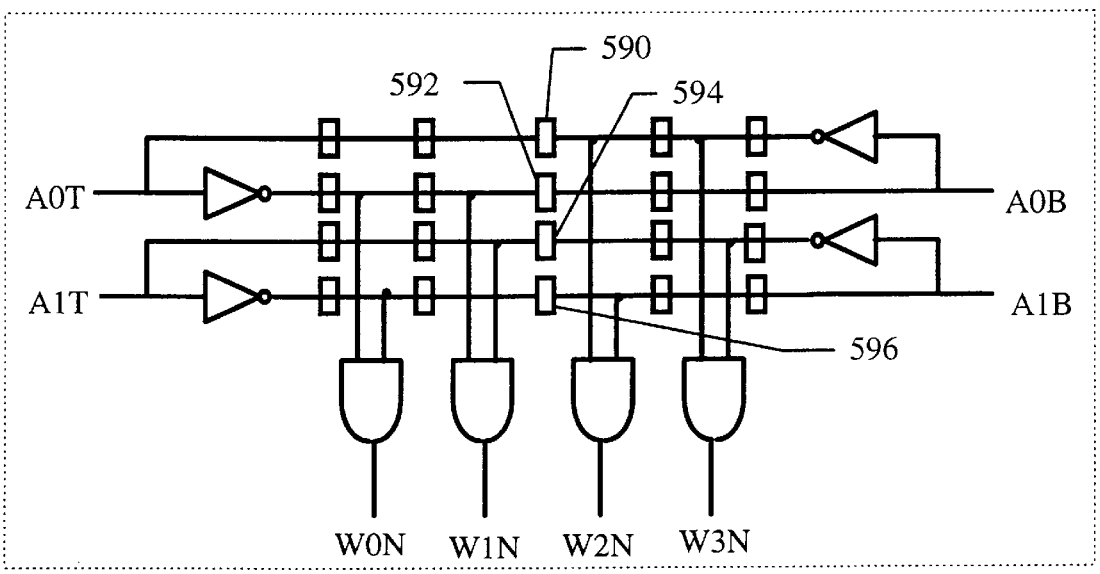

Reference is now made to FIGS. 19A, 19B and 19C, which are simplified illustrations of the portions shown in respective FIGS. 4A, 4B and 4C customized by laser ablation, etching or customized metal deposition to produce a 2 word by 2 bit single port RAM and a 2 word by 2 bit ROM.

It is seen in FIG. 19A that links 550, 552, 554, 556, 558, 560, 562, 564 and 566 in each pair of adjacent cells are cut in RAM cell pairs 569 and 570, which together define the 2 word by 2 bit single port RAM and that links 552, 554, 556, 560, 562, 564 and 566 in each pair of adjacent cells are cut in RAM cell pairs 571 and 572, which together define the 2 word by 2 bit ROM. Additionally links 580, 582, 584 and 586 along bit lines 82 and 83 are also cut to separate pairs of adjacent RAM cells 70 to define separate memories.

In FIGS. 19B and 19C links 590, 592, 594 and 596 are cut, it being appreciated that the decoder of FIG. 19C is redundant, its inputs being fixed. The decoder of FIG. 19B constitutes two X decoders for the embodiment of FIG. 19A.

Figure 20:
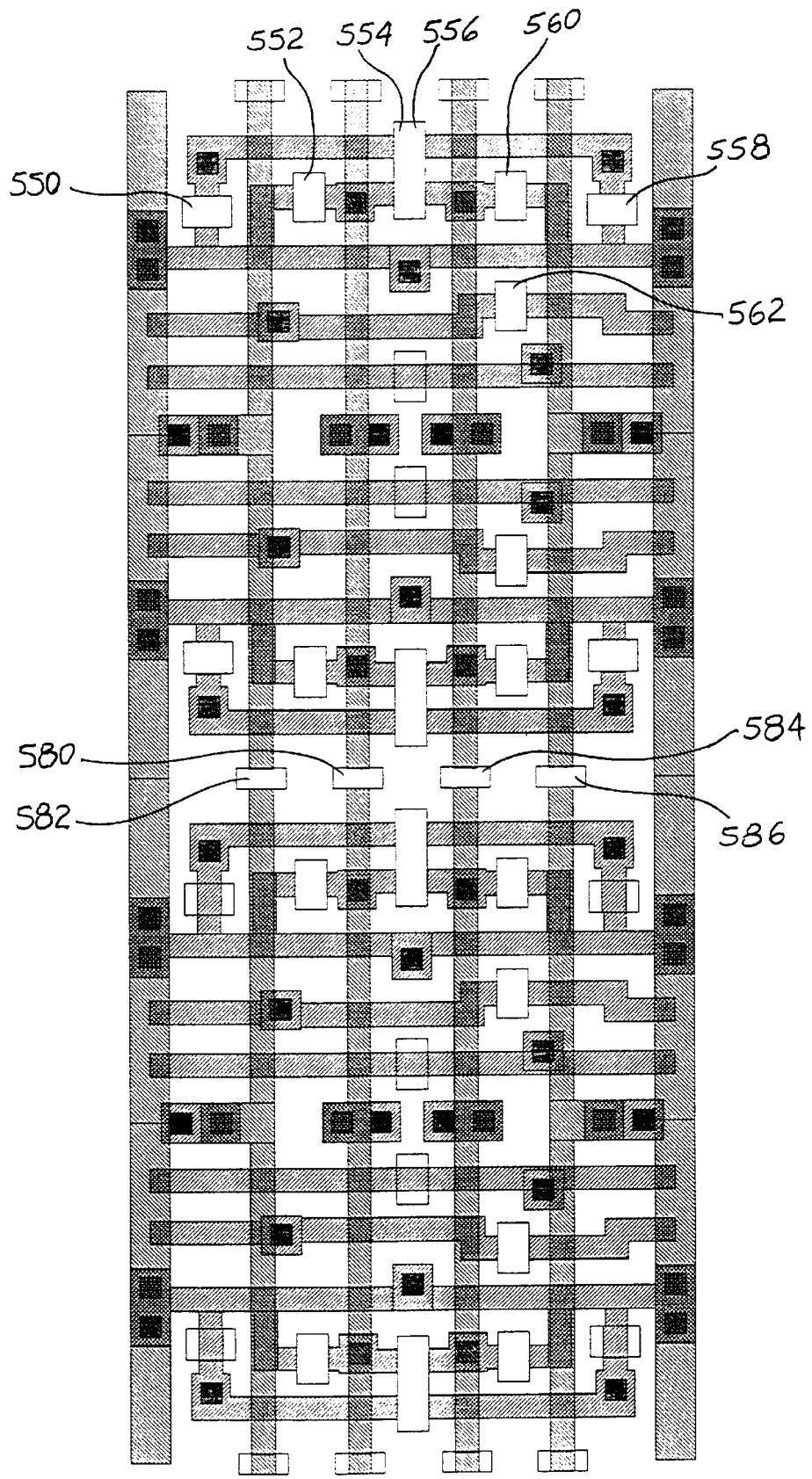
FIG. 20 is an illustration of the layout of FIG. 5B, following customization by laser ablation, etching or customized metal deposition to produce the memory portion of a 2 word by 2 bit single port RAM and a 2 word by 2 bit ROM.

Reference is now made to FIG. 20, which is an illustration of the layout of FIG. 5B, following customization by laser ablation, etching or customized metal deposition to produce the memory portion of a 2 word by 2 bit single port RAM and a 2 word by 2 bit ROM. The cut links are identified by the same reference numerals employed in FIG. 19A.

Figure 21A:
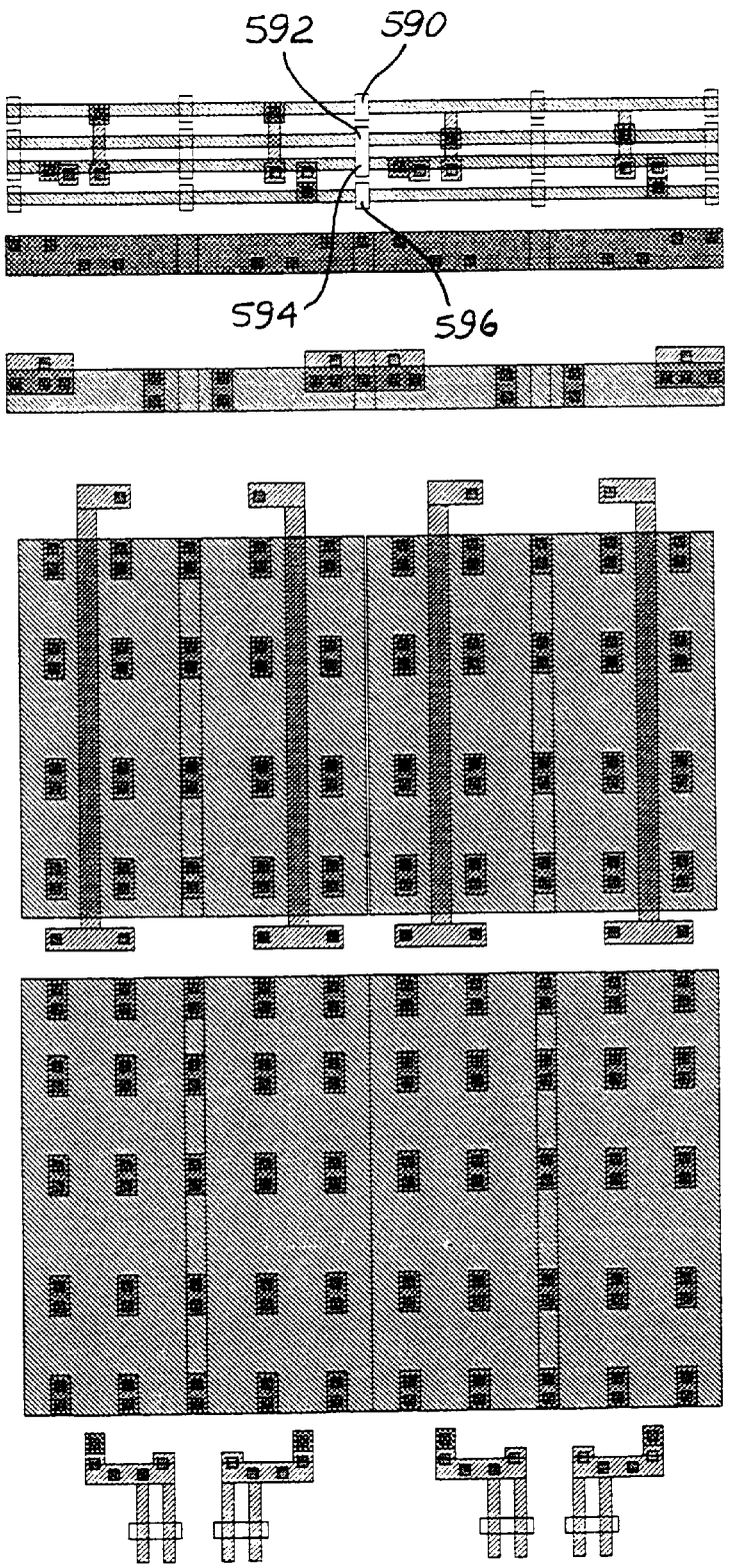
FIGS. 21A and 21B are illustrations of the layout of FIG. 6B, following customization by laser ablation, etching or customized metal deposition to produce a decoder portion of a 2 word by 2 bit single port RAM and a 2 word by 2 bit ROM corresponding to the circuitry of FIGS. 4B and 4C respectively.
Figure 21B:
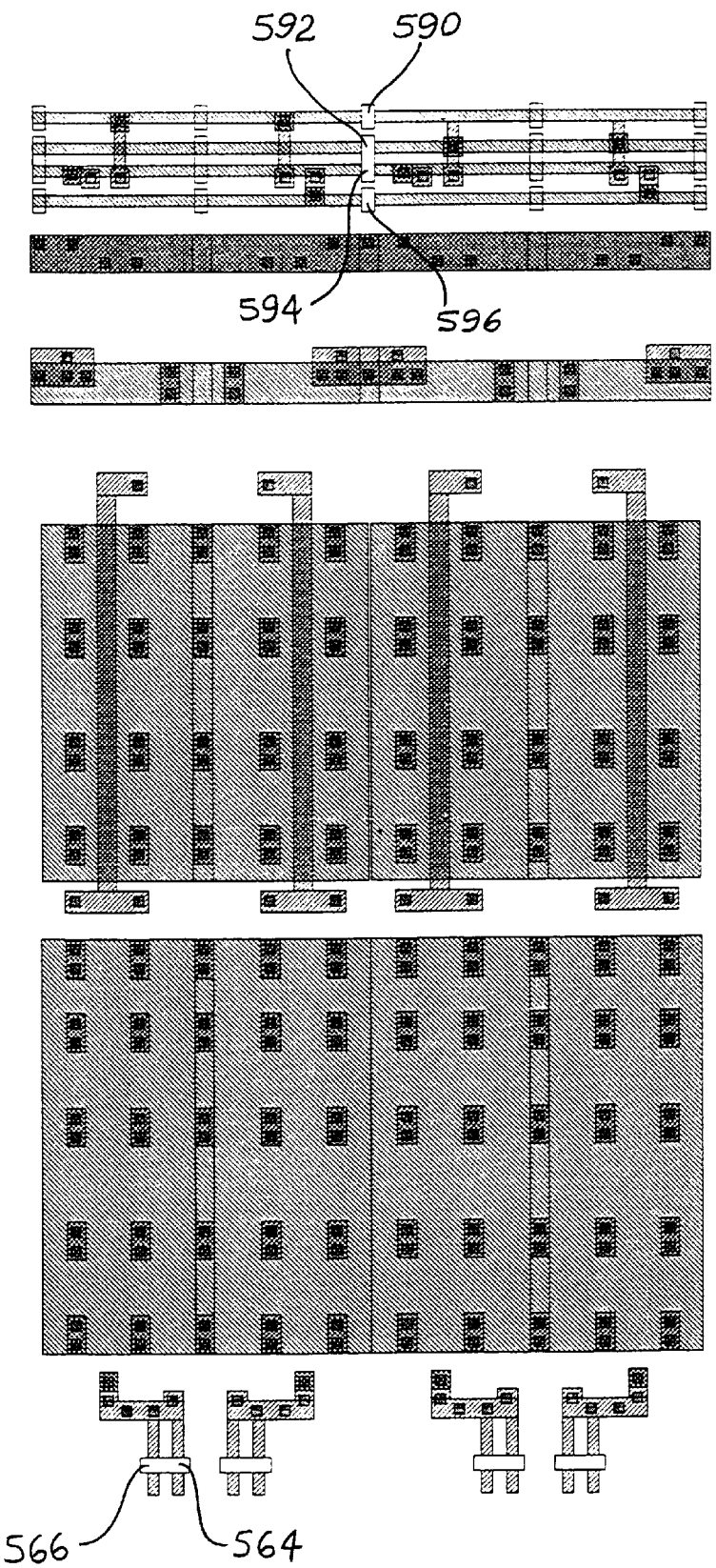

Reference is now made to FIGS. 21A and 21B, which are illustrations of the layout of FIG. 6B, following customization by laser ablation, etching or customized metal deposition to produce a decoder portion of a 2 word by 2 bit single port RAM and a 2 word by 2 bit ROM.

FIG. 21A illustrates a decoder corresponding to the circuitry of FIG. 19B. The cut links are identified by the same reference numerals employed in FIG. 19B.

FIG. 21B illustrates a redundant decoder corresponding to the circuitry of FIG. 19C. The cut links 590, 592, 594 and 596 are identified by the same reference numerals employed in FIG. 19C. The cut links 564 and 566 are identified by the same reference numerals employed in FIG. 19A.

Figure 22A:
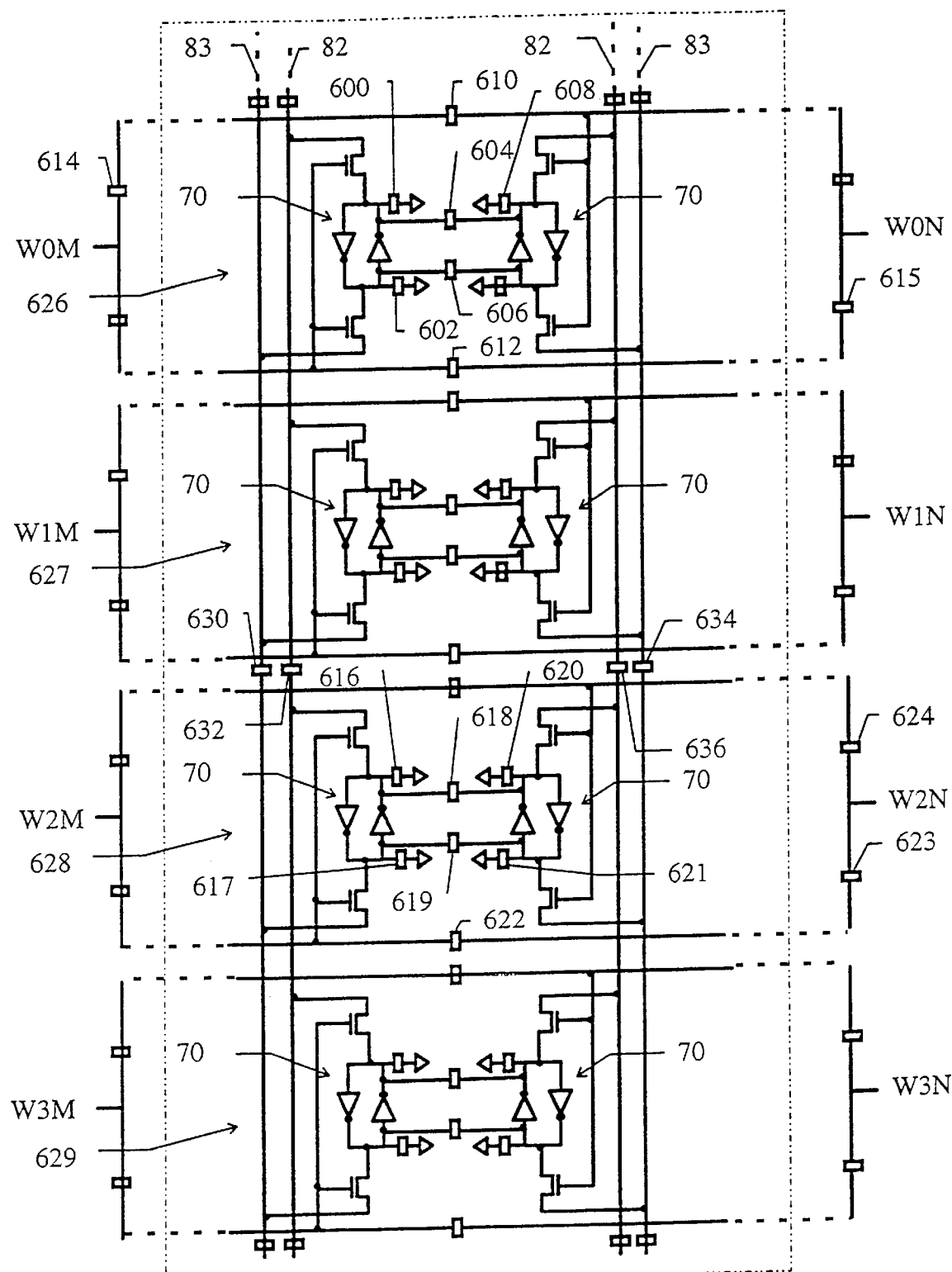
FIGS. 22A, 22B and 22C are simplified illustrations of the portions shown in respective FIGS. 4A, 4B and 4C customized to provide one 2 word by 1 bit ROM, one 2 word by 1 bit single port RAM and one 2 word by 2 bit single port RAM.
Figure 22B:
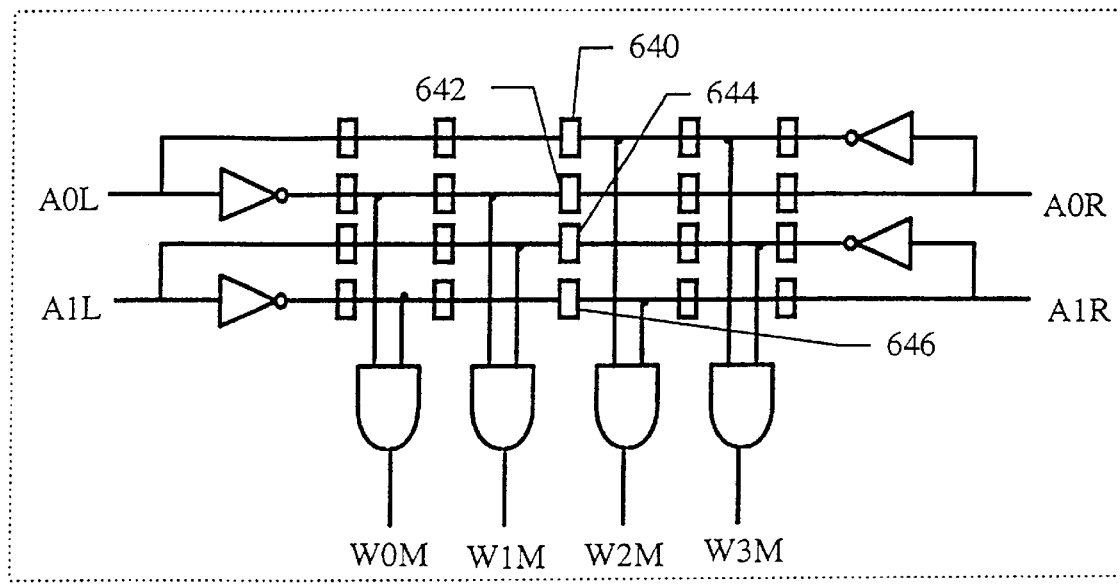
Figure 22C:
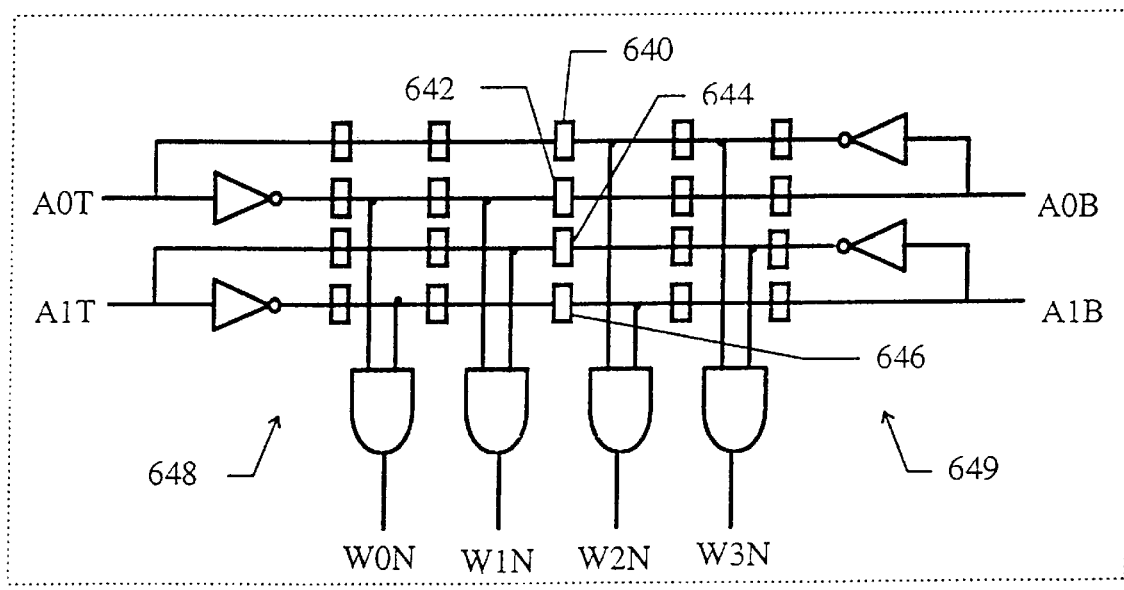

Reference is now made to FIGS. 22A, 22B and 22C, which are simplified illustrations of the portions shown in respective FIGS. 4A, 4B and 4C customized by laser ablation, etching or customized metal deposition to produce one 2 word by 1 bit ROM, one 2 word by 1 bit single port RAM and one 2 word by 2 bit single port RAM.

It is seen in FIG. 22A that links 600, 602, 604, 606, 608, 610, 612, 614 and 615 are cut in RAM cell pairs 626 and 627 and that links 616, 617, 618, 619, 620, 621, 622, 623, and 624 are cut in RAM cell pairs 628 and 629. Additionally links 630, 632, 634 and 636 along bit lines 82 and 83 are also cut to separate pairs of adjacent RAM cells 70 to define separate memories.

In FIGS. 22B and 22C links 640, 642, 644 and 646 are cut, the decoder of FIG. 22B functioning as two separate decoders, while the decoder of FIG. 22C provides a single decoder 648 and a redundant decoder 649, whose inputs are fixed.

Figure 23:
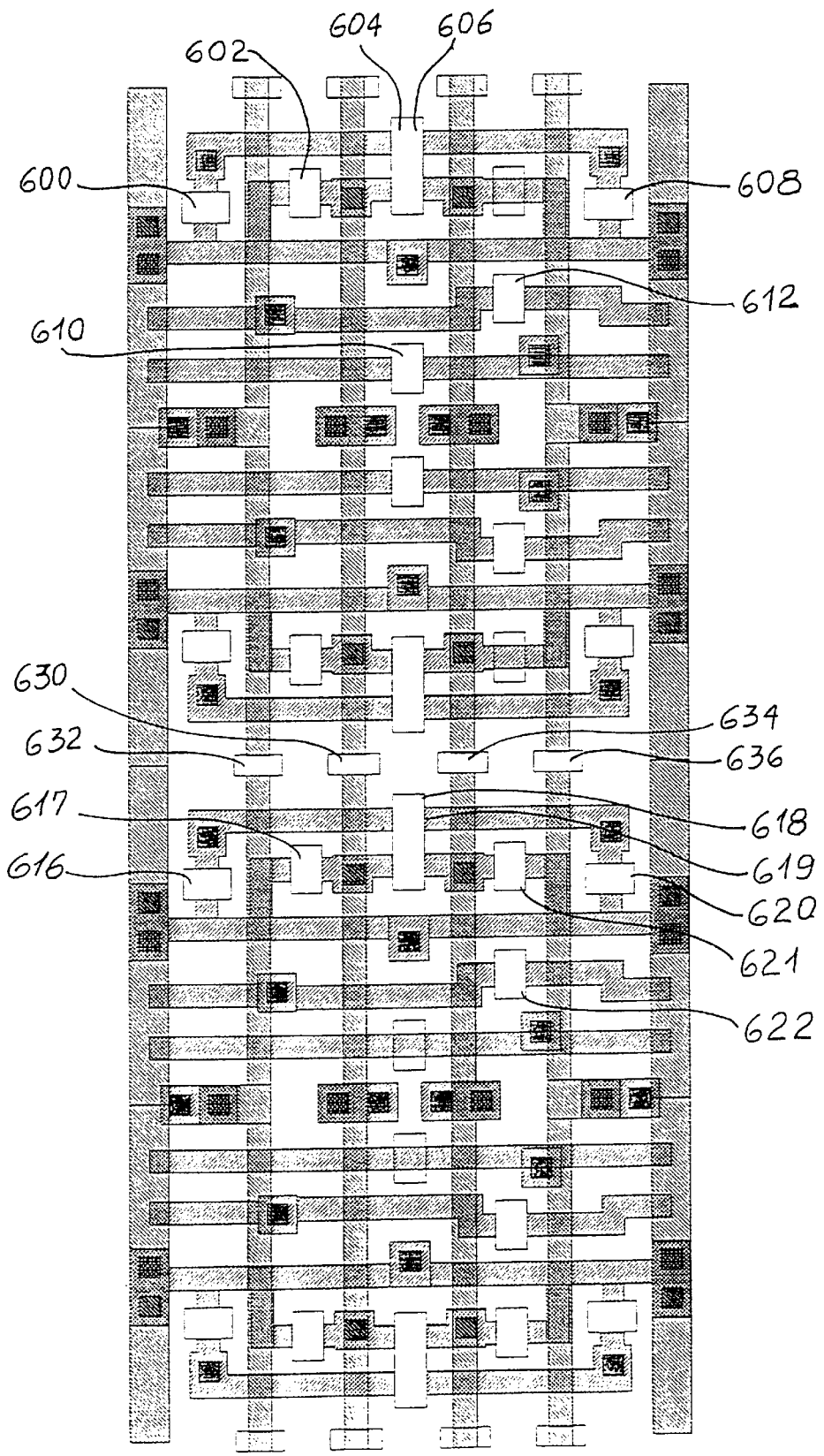
FIG. 23 is an illustration of the layout of FIG. 5B, following customization by laser ablation, etching or customized metal deposition to produce the memory portion of one 2 word by 1 bit ROM, one 2 word by 1 bit single port RAM and one 2 word by 2 bit single port RAM.

Reference is now made to FIG. 23, which is an illustration of the layout of FIG. 5B, following customization by laser ablation, etching or customized metal deposition to produce the memory portion of one 2 word by 1 bit ROM, one 2 word by 1 bit single port RAM and one 2 word by 2 bit single port RAM. The cut links are identified by the same reference numerals employed in FIG. 22A.

Figure 24A:
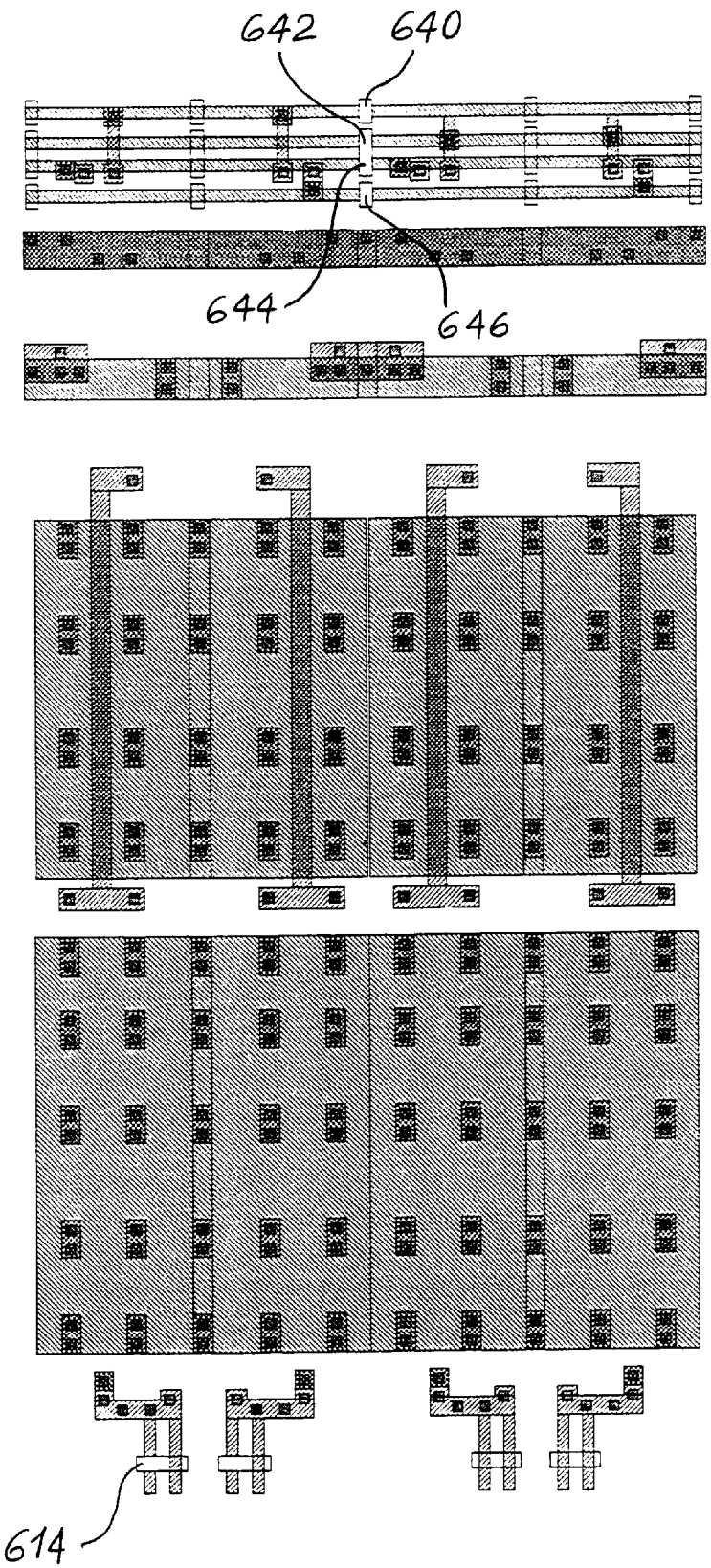
FIGS. 24A and 24B are illustrations of the layout of FIG. 6B, following customization by laser ablation, etching or customized metal deposition to produce a single decoder, forming part of the 2 word by 1 bit ROM, and a pair of decoders forming part of the 2 word by 1 bit single port RAM and the 2 word by 2 bit single port RAM corresponding to the circuitry of FIGS. 4B and 4C respectively.
Figure 24B:
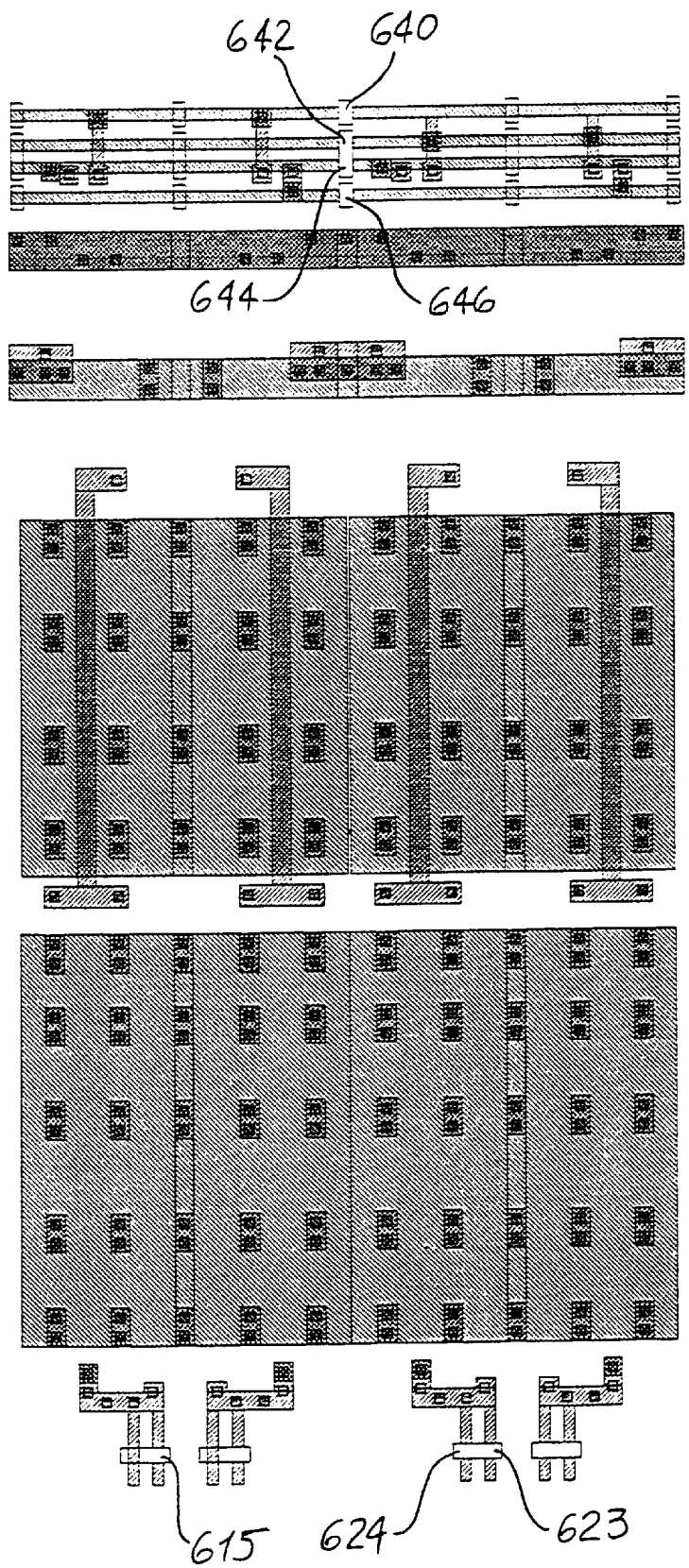

Reference is now made to FIGS. 24A and 24B, which are illustrations of the layout of FIG. 6B, following customization by laser ablation, etching or customized metal deposition to produce decoders for the one 2 word by 1 bit ROM, one 2 word by 1 bit single port RAM and one 2 word by 2 bit single port RAM. Two decoders having the configuration shown in FIG. 6B are employed, two parts of one decoder being used with the 2 word by 2 bit single port RAM and the 2 word by 1 bit single port RAM and one part of the other decoder being used for the ROM. The other part of the other decoder is redundant, its inputs being fixed.

FIG. 24A illustrates a decoder corresponding to the circuitry of FIG. 22B. The cut links 640, 642, 644 and 646 are identified by the same reference numerals employed in FIG. 22B. The cut link 614 is identified by the same reference numeral employed in FIG. 22A.

FIG. 24B illustrates a decoder corresponding to the circuitry of FIG. 22C. The cut links 640, 642, 644 and 646 are identified by the same reference numerals employed in FIG. 22C. The cut links 615, 623 and 624 are identified by the same reference numerals employed in FIG. 22A.

It will be appreciated by persons skilled in the art that the present invention is not limited to what has been particularly shown and described hereinabove. Rather the scope of the present invention is defined only by the claims which follow:

We claim:

1. A customizable gate array device comprising:
    a non-electrically customizable gate array portion; and
    a non-electrically customizable memory portion,
    said non-electrically customizable memory portion including at least one non-electrically customizable decoder which has two address ports and comprises two independently operable decoder portions, each counting up from zero and being associated with one of the two address ports.

2. A customizable gate array device according to claim 1 and wherein said customizable memory portion comprises:
    a multiplicity of identical memory cells; and
    customizable memory cell connections enabling said multiplicity of identical memory cells to function selectably as a RAM or a ROM.

3. A customizable gate array device according to claim 1 and wherein said customizable memory portion comprises:
    a multiplicity of identical memory cells; and
    customizable memory cell connections enabling said multiplicity of identical memory cells to be actuated via a selectable number of ports.

4. A customizable gate array device according to claim 3 and also comprising:
    customizable memory cell connections enabling said multiplicity of identical memory cells to function selectably as a RAM or a ROM.

5. A device according to claim 1 and wherein said customizable memory portion comprises:
    a non-customizable CMOS structure up to and including a first metal layer; and
    at least second and third customizable metal layers formed over said first metal layer.

6. A device according to claim 5 and wherein said at least second and third customizable metal layers include customizable links formed over memory cells.

7. A device according to claim 5 and wherein said at least second and third customizable metal layers include customizable links formed over active areas of memory cells.

8. A device according to claim 5 and wherein said customizable at least second and third metal layers comprise custom configured metal layers providing selected connections.

9. A device according to claim 1 and wherein said non-electrically customizable memory portion is laser customizable.

10. A device according to claim 1 and wherein said non-electrically customizable gate array portion and said non-electrically customizable memory portion are both customizable by the same technique.

11. A device according to claim 10 and wherein said non-electrically customizable gate array portion and sad non-electrically customizable memory portion are both laser customizable.

12. A device according to claim 1 and wherein said non-electrically customizable memory portion is customizable by etching of said customizable links.

13. A device according to claim 1 and wherein said non-electrically customizable gate array portion and said non-electrically customizable memory portion are both customizable by etching of said customizable links.

14. A device according to claim 1 and wherein said customizable memory portion comprises at least two custom configured metal layers providing selected connections.

15. A device according to claim 1 and wherein said customizable gate array portion and said customizable memory portion both comprise at least two custom configured metal layers providing selected connections.

16. A device according to claim 1 and wherein said non-electrically customizable memory includes at least one non-electrically customizable data interface.

17. A customizable memory device comprising:
    a multiplicity of identical memory cells; and
    non-electrically customizable memory cell connections enabling said multiplicity of identical memory cells to function selectably as one or more memory units,
    said multiplicity of memory cells and said non-electrically customizable memory cell connections providing at least one non-electrically customizable decoder which has two address ports and comprises two independently operable decoder portions.

18. A customizable memory device according to claim 17 and wherein said one or more memory unit comprises a plurality of memory units of the same type.

19. A customizable memory device according to claim 17 and wherein said one or more memory unit comprises a plurality of memory units of different types.

20. A customizable memory device according to claim 17 and wherein said one or more memory unit comprises a plurality of memory units of the same size.

21. A customizable memory device according to claim 17 and wherein said one or more memory unit comprises a plurality of memory units of different sizes.

22. A customizable memory device comprising:

a multiplicity of identical memory cells; and non-electrically customizable memory cell connections enabling said multiplicity of identical memory cells to function selectably as a RAM or a ROM, said multiplicity of memory cells and said non-electrically customizable memory cell connections providing at least one non-electrically customizable decoder which has two address ports and comprises two independently operable decoder portions.

23. A device according to claim 22 and wherein said customizable memory device comprises:

a non-customizable CMOS structure up to and including a first metal layer; and at least second and third customizable metal layers formed over said first metal layer.

24. A device according to claim 23 and wherein said at least second and third customizable metal layers include customizable links formed over memory cells.

25. A customizable memory device comprising:

a multiplicity of identical memory cells; and non-electrically customizable memory cell connections enabling said multiplicity of identical memory cells to be actuated via a selectable number of ports, said multiplicity of memory cells and said non-electrically customizable memory cell connections providing at least one non-electrically customizable decoder which has two address ports and comprises two independently operable decoder portions.

26. A customizable memory device according to claim 25 and also comprising:

customizable memory cell connections enabling said multiplicity of identical memory cells to function selectably as a RAM or a ROM.

27. A device according to claim 25 and wherein said customizable memory portion comprises:

a non-customizable CMOS structure up to and including a first metal layer; and at least second and third customizable metal layers formed over said first metal layer.

28. A device according to claim 27 and wherein said at least second and third customizable metal layers include customizable links formed over memory cells.

* * * * *

UNITED STATES PATENT AND TRADEMARK OFFICE
CERTIFICATE OF CORRECTION

PATENT NO. : 5,903,490
DATED : May 11, 1999
INVENTOR(S) : Rotem et al.

It is certified that error appears in the above-identified patent and that said Letters Patent is hereby corrected as shown below:

Col. 11, line 59-61 (Claim 1), delete ", each counting up from zero and being associated with one of the two address ports"

Col. 14, after line 27, insert the following new claim:

--29. A device according to claim 1, wherein said two independently operable decoder portions each count up from zero and are associated with one of the two address ports.--

Signed and Sealed this

Eighteenth Day of January, 2000

Attest:

Attesting Officer

Q. TODD DICKINSON

Commissioner of Patents and Trademarks